United States Patent
Lin

(10) Patent No.: US 11,146,295 B1
(45) Date of Patent: Oct. 12, 2021

(54) DECODING METHOD, MEMORY STORAGE DEVICE, AND MEMORY CONTROLLING CIRCUIT UNIT

(71) Applicant: PHISON ELECTRONICS CORP., Miaoli (TW)

(72) Inventor: Yu-Hsiang Lin, Yunlin County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/862,576

(22) Filed: Apr. 30, 2020

(30) Foreign Application Priority Data

Mar. 27, 2020 (TW) .................................. 109110493

(51) Int. Cl.
H03M 13/00 (2006.01)
H03M 13/39 (2006.01)
H03M 13/09 (2006.01)
H03M 13/11 (2006.01)

(52) U.S. Cl.
CPC ..... *H03M 13/3927* (2013.01); *H03M 13/098* (2013.01); *H03M 13/1108* (2013.01); *H03M 13/1111* (2013.01)

(58) Field of Classification Search
None
See application file for complete search history.

(56) References Cited

U.S. PATENT DOCUMENTS

| 9,086,982 B1 * | 7/2015 | Xu ........................ G11C 29/028 |
| 2007/0014160 A1 * | 1/2007 | Kobernik ........... G11C 16/0475 365/185.23 |
| 2017/0206130 A1 * | 7/2017 | Hsiao ................ H03M 13/6325 |

\* cited by examiner

*Primary Examiner* — Guerrier Merant
(74) *Attorney, Agent, or Firm* — JCIPRNET

(57) ABSTRACT

A decoding method, a memory storage device and a memory controlling circuit unit are provided. The method includes: receiving a read command sequence for reading a plurality of bits from the memory cells; calculating a first count value of a first value and a second count value of a second value in the bits; and adjusting a decoding parameter corresponding to the bits to a specific decoding parameter according to the first count value and the second count value, and performing a decoding operation according to the specific decoding parameter, where the adjusted decoding parameter affects a probability that the bits are considered as an error bit in the decoding operation.

24 Claims, 15 Drawing Sheets

| Lower physical programming unit | Middle physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

FIG. 11

DECODING METHOD, MEMORY STORAGE DEVICE, AND MEMORY CONTROLLING CIRCUIT UNIT

CROSS-REFERENCE TO RELATED APPLICATION

This application claims the priority benefit of Taiwan application serial no. 109110493, filed on Mar. 27, 2020. The entirety of the above-mentioned patent application is hereby incorporated by reference herein and made a part of this specification.

BACKGROUND

1. Technology Field

The invention relates to a decoding method, and more particularly, to a decoding method, a memory storage device and a memory controlling circuit unit.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

Generally, in order to ensure correctness of data stored by the rewritable non-volatile memory module, before data is stored into the rewritable non-volatile memory module, such data would be encoded first. The encoded data (including original and error correcting codes) may be stored into the rewritable non-volatile memory module. Later, the encoded data may be read from the rewritable non-volatile memory module and decoded to correct possible errors in the data. The error correcting code may use, for example, an algebraic decoding algorithm such as (BCH code), or a probability decoding algorithm such as a low density parity check code (LDPC). The low density parity check code uses a sparse matrix for encoding and decoding. In general, an LDPC decoder will perform a decoding through unsatisfied check node information or a log-likelihood ratio (LLR) in iterative decoding operations. Accordingly, how to obtain an appropriate LLR value to improve the performance of LDPC decoding is a topic of concern to persons skilled in the art.

SUMMARY

The invention provides a decoding method, a memory storage device and a memory controlling circuit unit, which can calculate a distribution of a first value and a second value and adjust a decoding parameter according to an evenness of the distribution so that the decoding correction capability and a probability of successful decoding can be improved to reduce decoding delay.

The invention provides a decoding method for a rewritable non-volatile memory module, wherein the rewritable non-volatile memory module includes a plurality of memory cells. The decoding method includes: receiving a read command sequence, wherein the read command sequence is for reading a plurality of bits from the memory cells; calculating a first count value of a first value and a second count value of a second value in the bits; and adjusting a decoding parameter corresponding to the bits to a specific decoding parameter according to the first count value and the second count value, and performing a decoding operation according to the specific decoding parameter, wherein the adjusted decoding parameter affects a probability that the bits are considered as an error bit in the decoding operation.

In an embodiment of the invention, the decoding parameter and the specific decoding parameter are a log likelihood ratio (LLR).

In an embodiment of the invention, an adjustment value for adjusting the decoding parameter to the specific decoding parameter is ±1~3.

In an embodiment of the invention, an adjustment value for adjusting the decoding parameter to the specific decoding parameter is ±10~20% of the decoding parameter.

In an embodiment of the invention, the decoding parameter includes one or more positive decoding parameters and one or more negative decoding parameters, and in the step of adjusting the decoding parameter corresponding to the bits to the specific decoding parameter according to the first count value and the second count value, an adjustment value for the one or more positive decoding parameters is different from an adjustment value for the one or more negative decoding parameters.

In an embodiment of the invention, the decoding parameter includes one or more positive decoding parameters and one or more negative decoding parameters, and in the step of adjusting the decoding parameter corresponding to the bits to the specific decoding parameter according to the first count value and the second count value, an adjustment value for the one or more positive decoding parameters is identical to an adjustment value of the one for more negative decoding parameters.

In an embodiment of the invention, before the step of adjusting the decoding parameter corresponding to the bits to the specific decoding parameter according to the first count value and the second count value, the decoding method further includes: adjusting a voltage level for reading the bits from the memory cells to a second voltage level according to the first count value and the second count value.

In an embodiment of the invention, the decoding operation is at least one of a hard bit decoding operation and a soft bit decoding operation.

The invention provides a memory storage device, which includes a connection interface unit, a rewritable non-volatile memory module and a memory controlling circuit unit. The connection interface unit is configured to couple to a host system. The rewritable non-volatile memory module includes a plurality of memory cells. The memory controlling circuit unit is coupled to the connection interface unit and the rewritable non-volatile memory module. The memory controlling circuit unit is configured to receive a read command sequence. The read command sequence is for reading a plurality of bits from the memory cells. The memory controlling circuit unit is further configured to calculate a first count value of a first value and a second count value of a second value in the bits through a counter, and the memory controlling circuit unit is further configured to adjust a decoding parameter corresponding to the bits to a specific decoding parameter according to the first count value and the second count value, and perform a decoding operation according to the specific decoding parameter, wherein the adjusted decoding parameter affects a probability that the bits are considered as an error bit in the decoding operation.

In an embodiment of the invention, the decoding parameter and the specific decoding parameter are a log likelihood ratio.

In an embodiment of the invention, an adjustment value for adjusting the decoding parameter to the specific decoding parameter is ±1~3.

In an embodiment of the invention, an adjustment value for adjusting the decoding parameter to the specific decoding parameter is ±10~20% of the decoding parameter.

In an embodiment of the invention, the decoding parameter includes one or more positive decoding parameters and one or more negative decoding parameters, and in the operation that the memory controlling circuit unit adjusts the decoding parameter corresponding to the bits to the specific decoding parameter according to the first count value and the second count value, an adjustment value for the one or more positive decoding parameters is different from an adjustment value for the one or more negative decoding parameters.

In an embodiment of the invention, the decoding parameter includes one or more positive decoding parameters and one or more negative decoding parameters, and in the operation that the memory controlling circuit unit adjusts the decoding parameter corresponding to the bits to the specific decoding parameter according to the first count value and the second count value, an adjustment value for the one or more positive decoding parameters is identical to an adjustment value of the one for more negative decoding parameters.

In an embodiment of the invention, before the operation of adjusting the decoding parameter corresponding to the bits to the specific decoding parameter according to the first count value and the second count value, the memory controlling circuit unit is further configured to adjust a voltage level for reading the bits from the memory cells to a second voltage level according to the first count value and the second count value.

In an embodiment of the invention, the decoding operation is at least one of a hard bit decoding operation and a soft bit decoding operation.

The invention provides a memory controlling circuit unit for controlling a memory storage device including a rewritable non-volatile memory module. The memory controlling circuit unit includes a host interface, a memory interface and a memory management circuit. The host interface is configured to couple to a host system. The memory interface is configured to couple to the rewritable non-volatile memory module, wherein the rewritable non-volatile memory module includes a plurality of memory cells. The memory management circuit is coupled to the host interface and the memory interface. The memory controlling circuit unit is configured to receive a read command sequence. The read command sequence is for reading a plurality of bits from the memory cells. The memory controlling circuit unit is further configured to calculate a first count value of a first value and a second count value of a second value in the bits through a counter, and the memory controlling circuit unit is further configured to adjust a decoding parameter corresponding to the bits to a specific decoding parameter according to the first count value and the second count value, and perform a decoding operation according to the specific decoding parameter, wherein the adjusted decoding parameter affects a probability that the bits are considered as an error bit in the decoding operation.

In an embodiment of the invention, the decoding parameter and the specific decoding parameter are a log likelihood ratio.

In an embodiment of the invention, an adjustment value for adjusting the decoding parameter to the specific decoding parameter is ±1~3.

In an embodiment of the invention, an adjustment value for adjusting the decoding parameter to the specific decoding parameter is ±10~20% of the decoding parameter.

In an embodiment of the invention, the decoding parameter includes one or more positive decoding parameters and one or more negative decoding parameters, and in the operation that the memory controlling circuit unit adjusts the decoding parameter corresponding to the bits to the specific decoding parameter according to the first count value and the second count value, an adjustment value for the one or more positive decoding parameters is different from an adjustment value for the one or more negative decoding parameters.

In an embodiment of the invention, the decoding parameter includes one or more positive decoding parameters and one or more negative decoding parameters, and in the operation that the memory controlling circuit unit adjusts the decoding parameter corresponding to the bits to the specific decoding parameter according to the first count value and the second count value, an adjustment value for the one or more positive decoding parameters is identical to an adjustment value of the one for more negative decoding parameters.

In an embodiment of the invention, before the operation of adjusting the decoding parameter corresponding to the bits to the specific decoding parameter according to the first count value and the second count value, the memory controlling circuit unit is further configured to adjust a voltage level for reading the bits from the memory cells to a second voltage level according to the first count value and the second count value.

In an embodiment of the invention, the decoding operation is at least one of a hard bit decoding operation and a soft bit decoding operation.

Based on the above, the decoding method, the memory storage device and the memory controlling circuit unit provided by the invention can calculate the distribution of the first value and the second value and determine whether the distribution is even. According to the evenness of the distribution, the memory controlling circuit unit can adjust the decoding parameter corresponding to the bits to the specific decoding parameter, and perform the decoding operation again according to the values of the bits and the specific decoding parameter to try and obtain a successfully decoded codeword. With the above method, the decoding correction capability and the probability of successful decoding can be improved to reduce decoding delay.

To make the aforementioned more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

FIG. 11 is a schematic diagram illustrating a memory cell storage structure and a physical erasing unit according to an exemplary embodiment.

DESCRIPTION OF THE EMBODIMENTS

Figure 1:
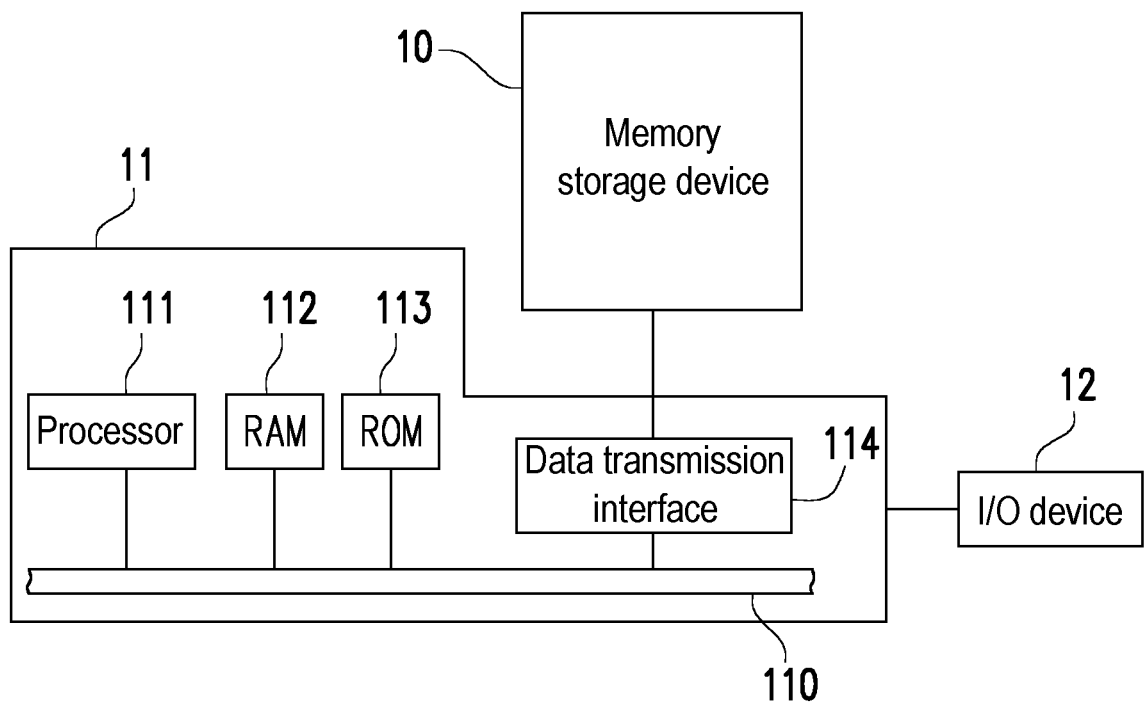
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the invention may comprise any one or more of the novel features described herein, including in the detailed description, and/or shown in the drawings. As used herein, "at least one," "one or more," and "and/or" are open-ended expressions that are both conjunctive and disjunctive in operation. For instance, each of the expressions "at least on of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
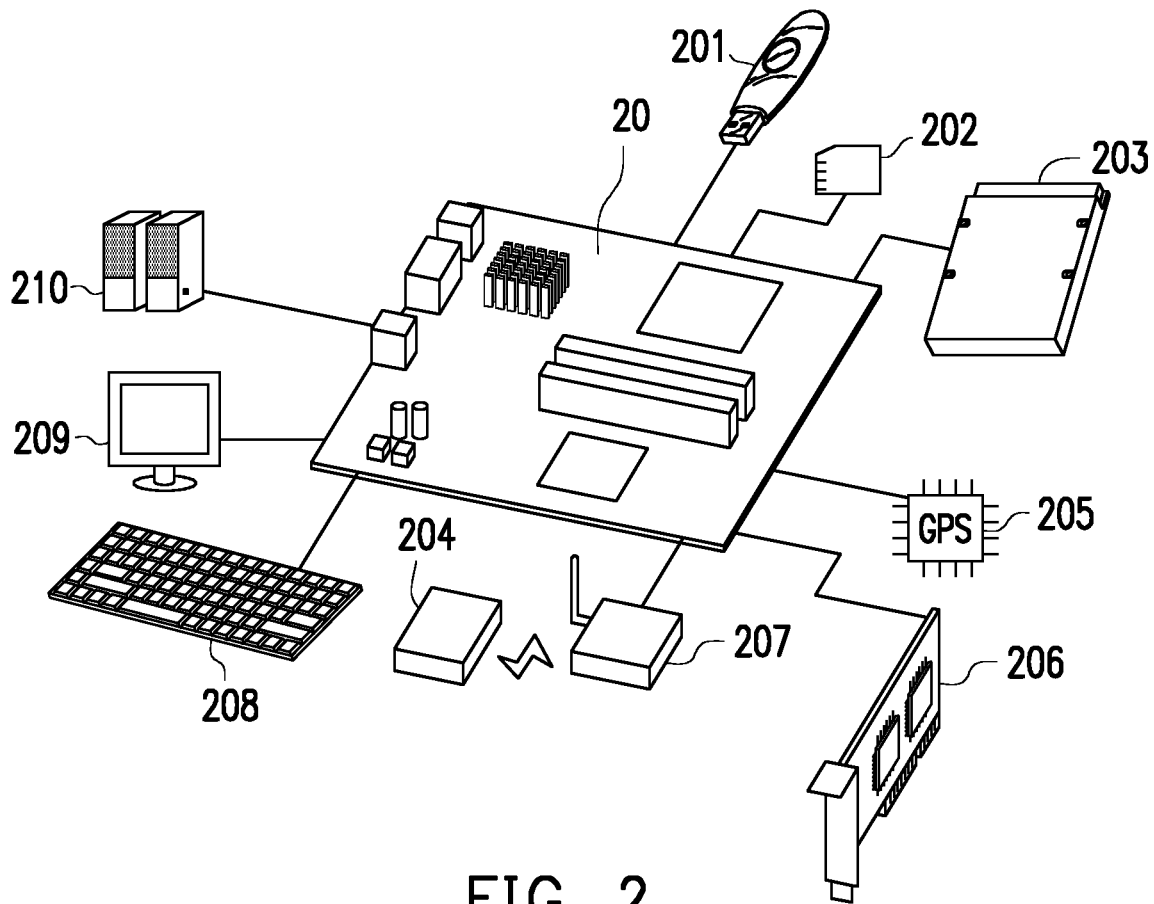
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage device 10 through the data transmission interface 114. For example, the host system 11 can store data into the memory storage device 10 or read data from the memory storage device 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, an SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
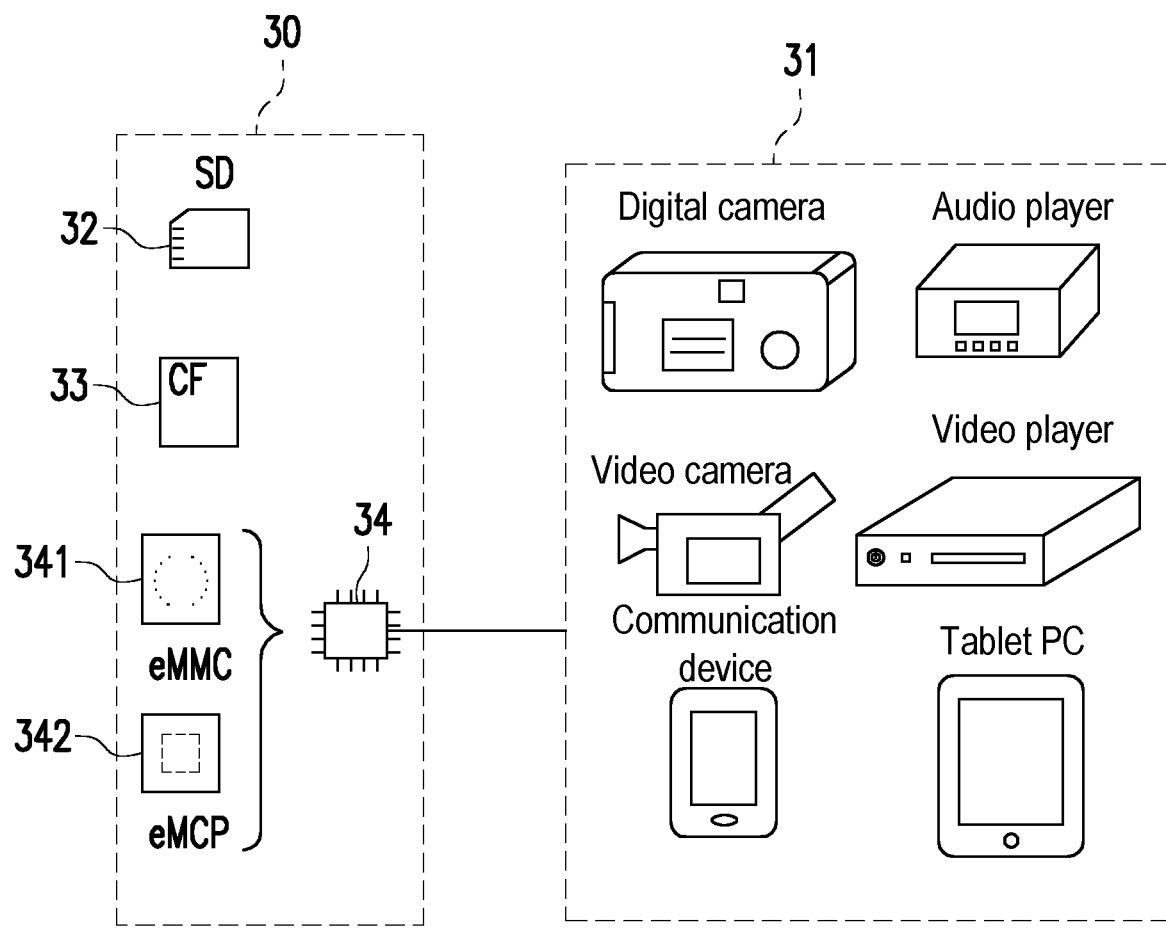
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the invention. Referring to FIG. 3, in another exemplary embodiment, a host system 31 may also be a system including a digital camera, a video camera, a communication device, an audio player, a video player or a tablet computer, whereas a memory storage device 30 may be various non-volatile memory storage devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
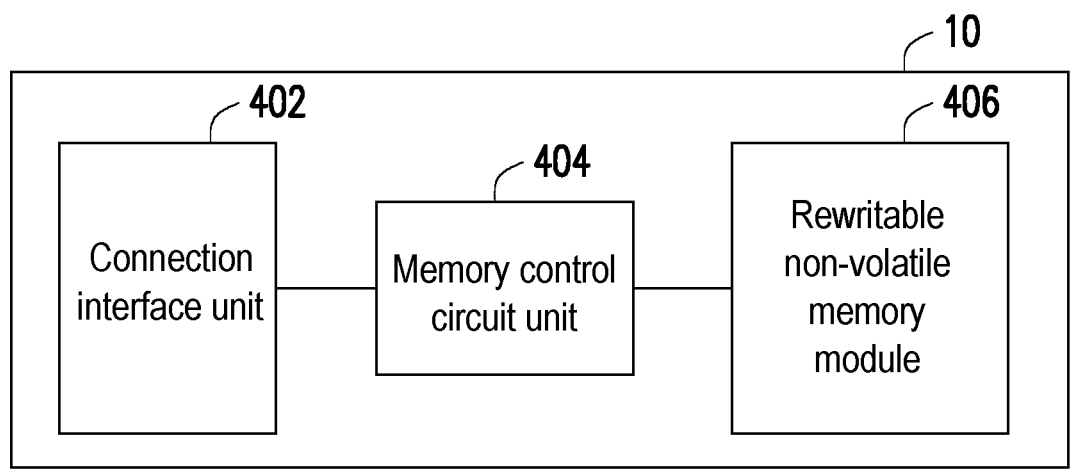
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory controlling circuit unit 404 and a rewritable non-volatile memory module 406.

In this exemplary embodiment, the connection interface unit 402 is compatible with a SATA (Serial Advanced Technology Attachment) standard. Nevertheless, it should be understood that the invention is not limited in this regard. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD (Secure Digital) interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. The connection interface unit 402 and the memory controlling circuit unit 404 may be packaged into one chip, or the connection interface unit 402 is distributed outside of a chip containing the memory controlling circuit unit 404.

The memory controlling circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory controlling circuit unit 404 and configured to store data written from the host system 11. The rewritable non-volatile memory module 406 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

The memory cells in the rewritable non-volatile memory module 406 are disposed in an array. The memory cell array arranged in a two-dimensional array is taken as an example for description. However, it should be noted that, the following exemplary embodiment is simply an example of the memory cell array. In other exemplary embodiments, a disposition method of the memory cell array may be adjusted to satisfy actual requirements.

Figure 5:
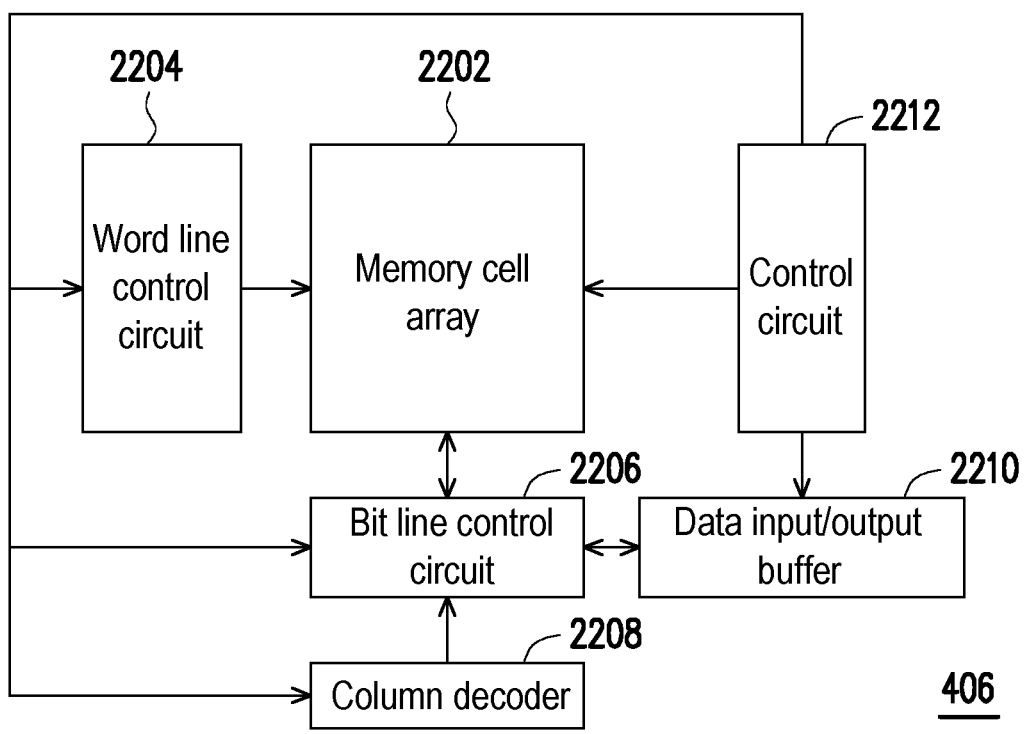
FIG. 5 is a schematic block diagram illustrating a rewritable non-volatile memory module according to an exemplary embodiment.
Figure 6:
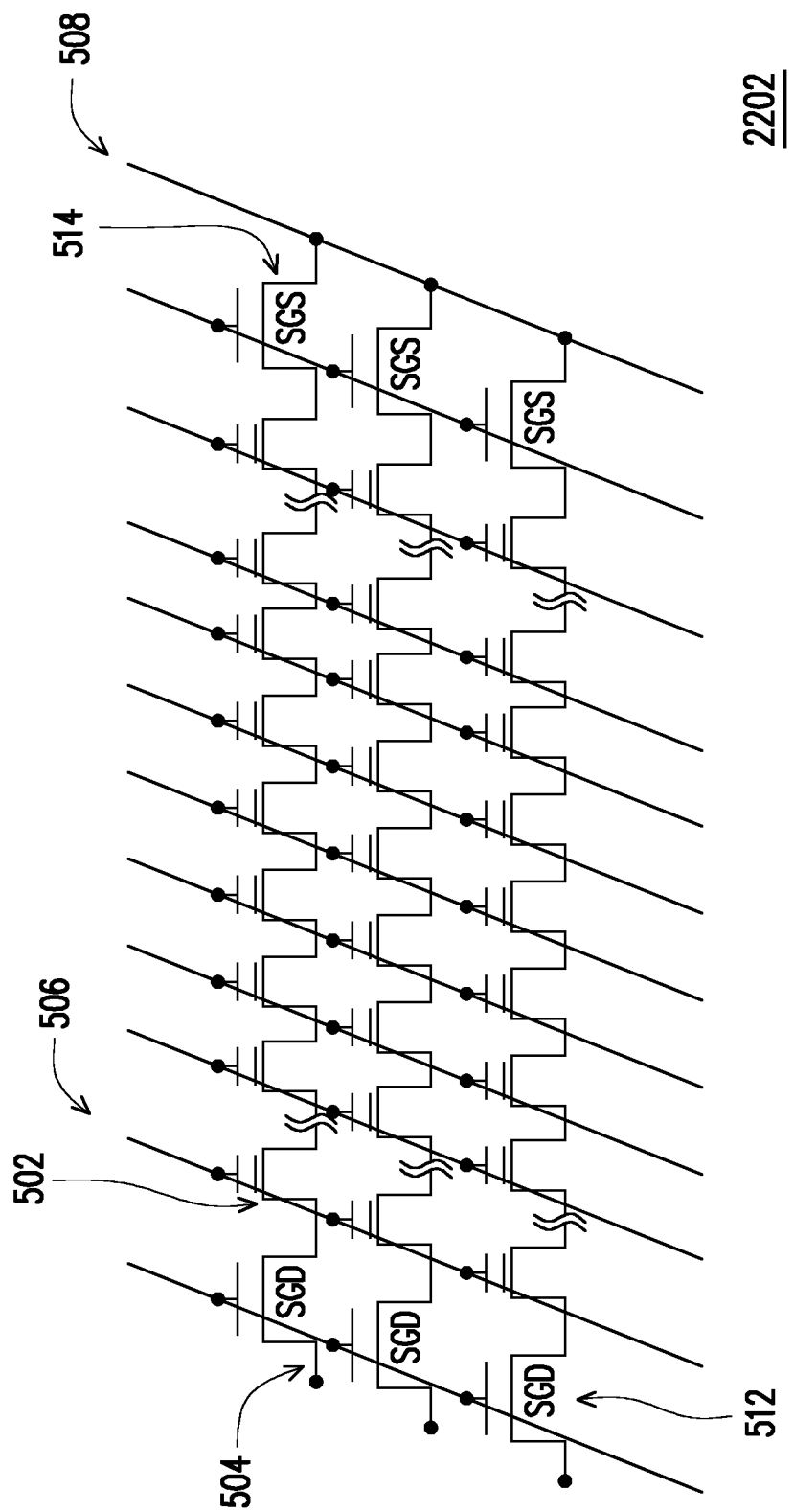
FIG. 6 is a schematic diagram illustrating a memory cell array according to an exemplary embodiment.

FIG. 5 is a schematic block diagram illustrating a rewritable non-volatile memory module according to an exemplary embodiment. FIG. 6 is a schematic diagram illustrating a memory cell array according to an exemplary embodiment.

Referring to FIG. 5 and FIG. 6 together, the rewritable non-volatile memory module 406 includes a memory cell array 2202, a word line control circuit 2204, a bit line control circuit 2206, a column decoder 2208, a data input/output buffer 2210 and a control circuit 2212.

In the present exemplary embodiment, the memory cell array 2202 may include a plurality of memory cells 502 used to store data, a plurality of select gate drain (SGD) transistors 512, a plurality of select gate source (SGS) transistors 514, as well as a plurality of bit lines 504, a plurality of word lines 506, a common source line 508 connected to the memory cells (as shown in FIG. 6). The memory cells 502 are disposed at intersections of the bit lines 504 and the word lines 506 in a matrix manner (or in a 3D stacking manner). When a write command or a read command is received from the memory controlling circuit unit 404, the control circuit 2212 controls the word line control circuit 2204, the bit line control circuit 2206, the column decoder 2208, the data input-output buffer 2210 to write the data into the memory cell array 2202 or read the data from the memory cell array 2202, wherein the word line control circuit 2204 is configured to control voltages applied to the word lines 506, the bit line control circuit 2206 is configured to control voltages applied to the bit lines 504, the column decoder 2208 is configured to select the corresponding bit line according to a row address in a command, and the data input/output buffer 2210 is configured to temporarily store the data.

The memory cell in the rewritable non-volatile memory module 406 may store multiple bits by changing a threshold voltage of one memory cell. More specifically, in each of the memory cells, a charge trapping layer is provided between a control gate and a channel. Amount of electrons in the charge trapping layer may be changed by applying a write voltage to the control gate thereby changing the threshold voltage of the memory cell. This process of changing the threshold voltage is also known as "writing data into the memory cell" or "programming the memory cell". Each of the memory cells in the memory cell array 2022 has a plurality of storage states depended on changes in the threshold voltage. The storage state of the memory cell may be determined through a read voltage, so as to obtain the bits stored by the memory cell.

Figure 7:
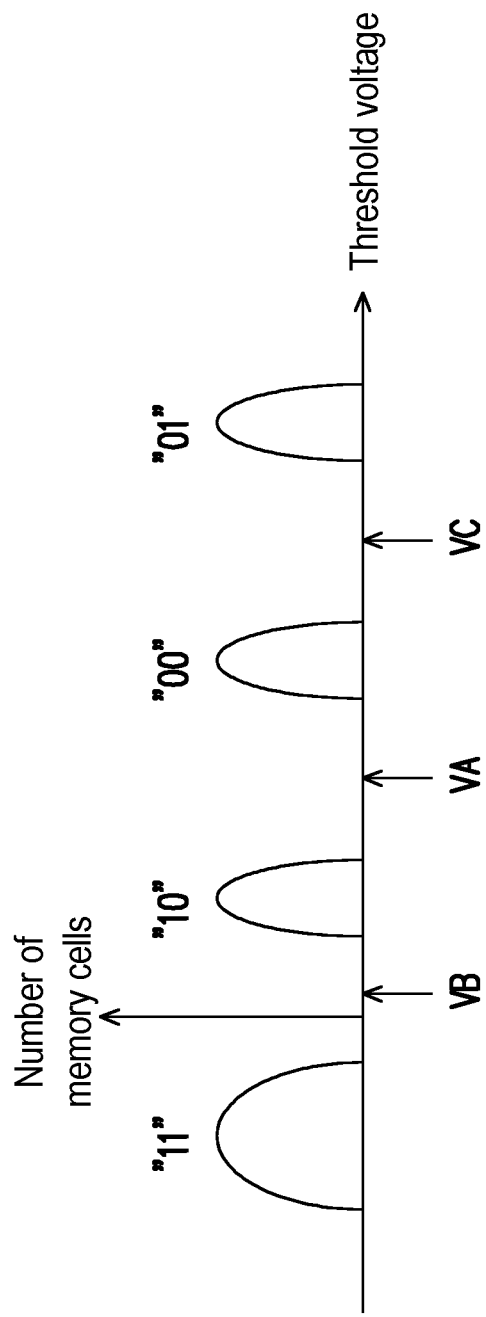
FIG. 7 is a histogram of a gate voltage corresponding to write data stored in the memory cell array according to an exemplary embodiment.

FIG. 7 is a histogram of a gate voltage corresponding to write data stored in the memory cell array according to an exemplary embodiment.

Figure 8:
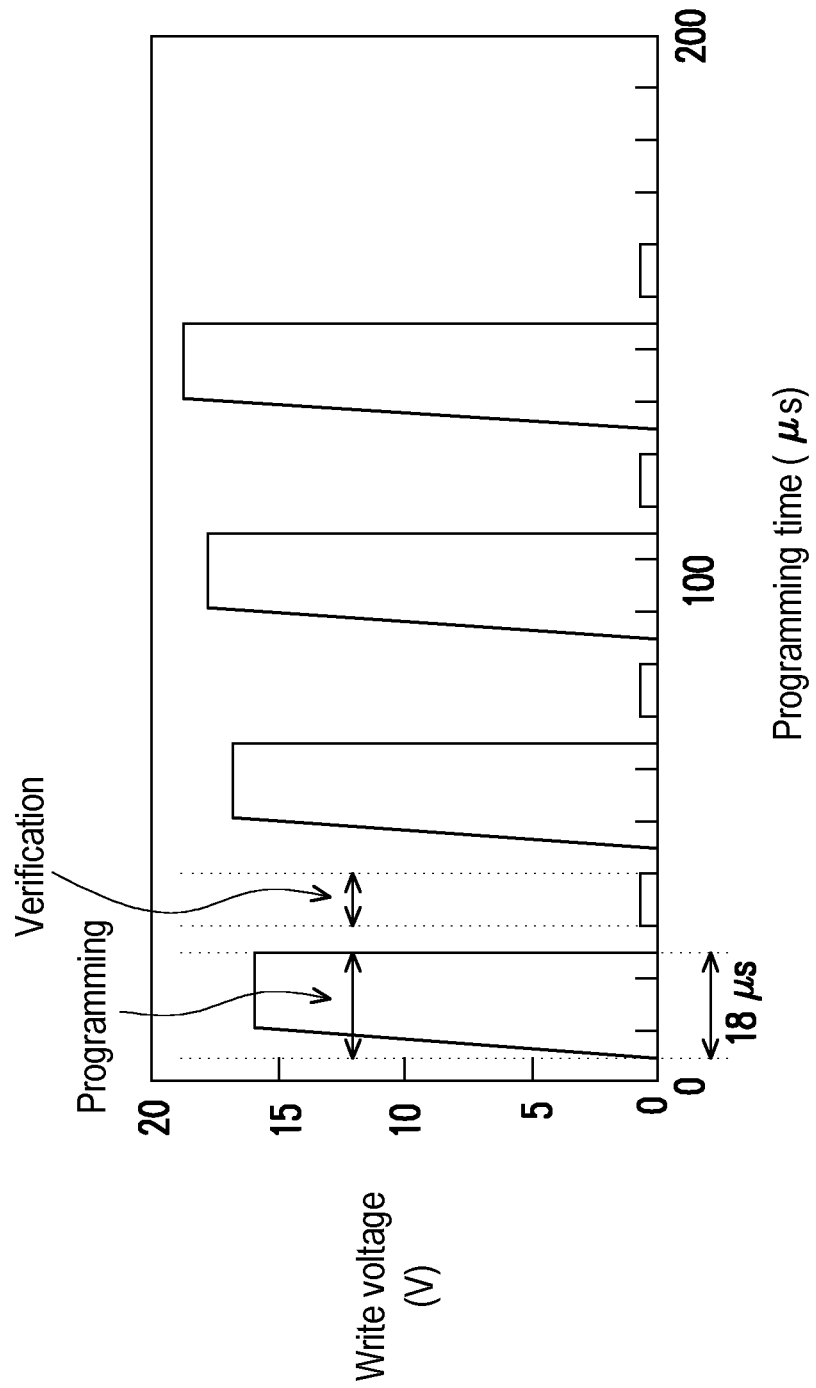
FIG. 8 illustrates a schematic diagram for programming a memory cell according to an exemplary embodiment.

Referring to FIG. 7, with the MLC NAND flash memory taken as an example, along with different threshold voltages, each memory cell has four storage states, and the storages states respectively represent bits of "11", "10", "00" and "01". In other words, each of the storage states includes a least significant bit (LSB) and a most significant bit (MSB). In the present exemplary embodiment, among the storage states (i.e., "11", "10", "00" and "01"), a first bit counted from the left is the LSB, and a second bit counted from the left is the MSB. Accordingly, in this exemplary embodiment, each of the memory cells can store two bits. It should be understood that, the storage states corresponding to the threshold voltage as illustrated in the FIG. 8 are merely an example. In another exemplary embodiment of the invention, the correspondence between the threshold voltages and the storage states may also be an arrangement of "11", "10", "00" and "01" or other arrangement along with increase of the threshold voltage. Moreover, in another exemplary embodiment, it can also be defined that the first bit counted from the left is the MSB, and the second bit counted from the left is the LSB.

FIG. 8 illustrates a schematic diagram for programming a memory cell according to an exemplary embodiment.

Referring to FIG. 8, in this exemplary embodiment, a programming operation of the memory cell is implemented by using a method of pulse writing/verifying threshold voltage. Specifically, when data is to be written into a memory cell, the memory controlling circuit unit 404 implements a data writing operation by setting an initial write voltage and a write pulse time, and instructs the control circuit 2212 of the rewritable non-volatile memory module 406 to program the memory cell for reading data by using the set initial write voltage and the write pulse time. Then, the memory controlling circuit unit 404 applies a verification voltage to the control gate to determine whether the memory cell is conducted, thereby determining whether the memory cell is in a correct storage state (having a correct threshold voltage). If the memory cell is not programmed to the correct storage state, the memory controlling circuit unit 404 instructs the control circuit 2212 to use the currently-applied write voltage plus an Incremental-step-pulse programming (ISPP) adjusting value as a new write voltage and program the memory cell again by using the new write voltage and the write pulse time. Conversely, if the memory cell is programmed to the correct storage state, it means that the data is correctly written into the memory cell. For example, the initial voltage is set to 16 volts (V), the write pulse time is set to 18 microseconds (μs) and the ISPP adjusting value is set to 0.6V. However, the invention is not limited in this regard.

Figure 9:
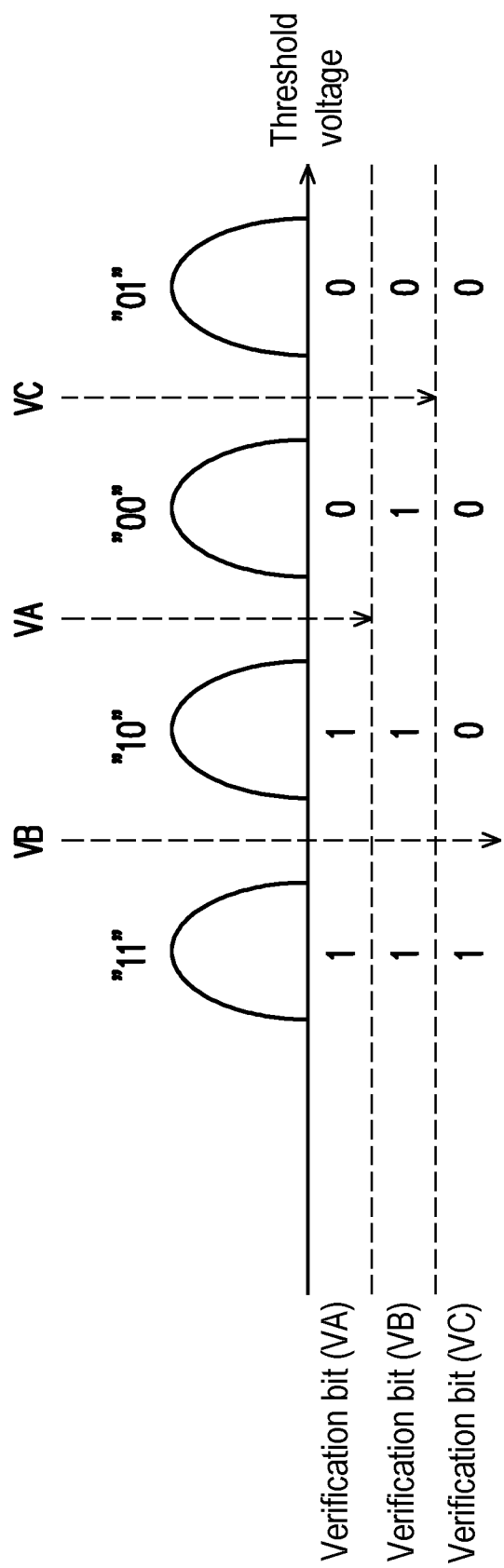
FIG. 9 illustrates a schematic diagram for reading data from a memory cell according to an exemplary embodiment.

FIG. 9 illustrates a schematic diagram of reading data from a memory cell according to an exemplary embodiment, which uses the MLC NAND flash memory for example.

Referring to FIG. 9, a reading operation for the memory cells of the memory cell array 2202 is implemented by applying a read voltage to the control gate, and identifying the data stored in the memory cell through a conduction state of the memory cell. A verification bit (VA) is configured to indicate whether the memory cell is conducted when a read voltage VA is applied; a verification bit (VB) is configured to indicate whether the memory cell is conducted when a read voltage VB is applied; a verification bit (VC) is configured to indicate whether the memory cell is conducted when a read voltage VC is applied. Here, it is assumed that the corresponding memory cell is conducted when the verification bit is "1", and the corresponding memory cell is not conducted when the verification bit is "0". As shown in FIG. 9, which of the storage states the memory cell is in may be determined according to the verification bits (VA) to (VC), thereby obtaining the bits being stored.

Figure 10:
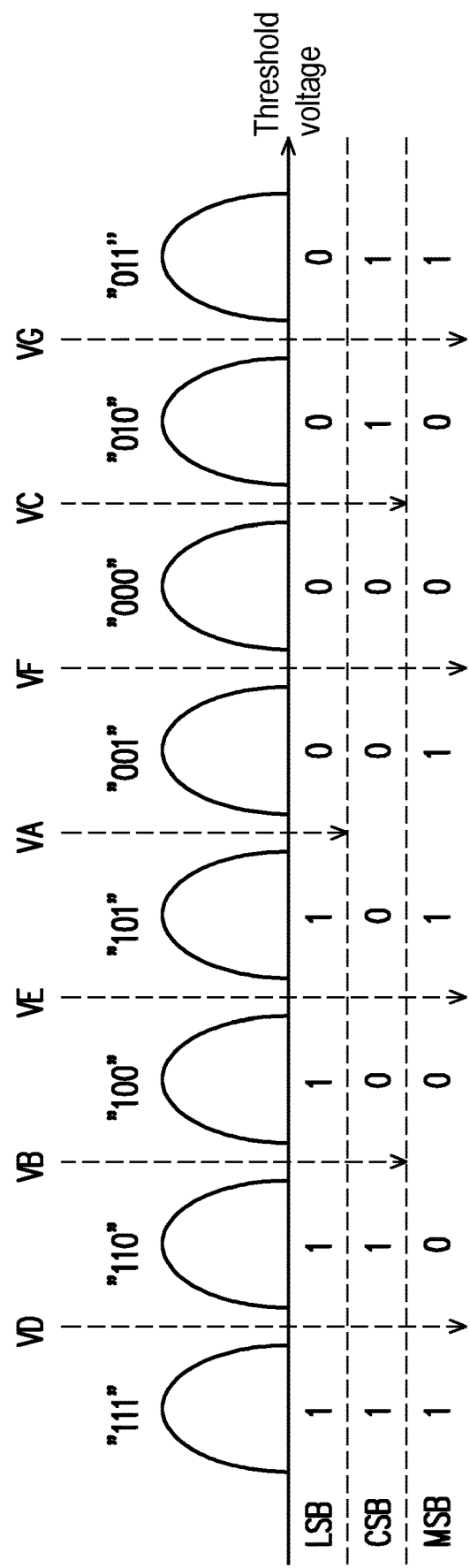
FIG. 10 illustrates a schematic diagram of reading data from a memory cell array according to another exemplary embodiment.

FIG. 10 illustrates a schematic diagram of reading data from a memory cell array according to another exemplary embodiment.

Referring to FIG. 10, a TLC NAND flash memory is taken as an example for description, each of the storages states includes the LSB of the first bit counted from the left, a center significant bit (CSB) of the second bit counted from the left and the MSB of a third bit counted from the left. In this example, according to different threshold voltages, the memory cell has 8 storage states (i.e., "111", "110", "100", "101", "001", "000", "010" and "011"). The bits stored in the memory cell may be identified by applying the read voltages VA to VC to the control gate.

Here, it should be noted that, with the MLC NAND flash memory taken as an example, the memory cells arranged on the same word line can constitute two physical programming units. Here, the physical programming unit constituted by the LSBs of said memory cells is known as the lower physical programming unit, and the physical programming unit constituted by the MSBs of said memory cells is known as the upper physical programming unit. With the TLC NAND flash memory taken as an example, the memory cells arranged on the same word line can constitute three physical programming units. Here, the physical programming unit constituted by the LSBs of said memory cells is known as the lower physical programming unit, the physical programming unit constituted by the CSBs of said memory cells is known as a middle physical programming unit, and the physical programming unit constituted by the MSBs of said memory cells is known as the upper physical programming unit.

FIG. 11 is a schematic diagram illustrating a memory cell storage structure and a physical erasing unit according to an exemplary embodiment.

Referring to FIG. 11, with the TLC NAND flash memory taken as an example, one physical erasing unit is constituted by a plurality of physical programming unit groups. Each of the physical programming unit groups includes the lower physical programming unit, the middle physical programming unit and the upper physical programming unit constituted by multiple memory cells arranged on the same word line. For example, in the physical erasing unit, the 0th physical programming unit belonging to the lower physical programming unit, the 1st physical programming unit belonging to the middle physical programming unit and the 2nd physical programming unit belonging to the upper physical programming unit are regarded as one physical programming unit group. Similarly, the 3rd, 4th, and 5th physical programming units are regarded as one physical programming unit group, and by analogy, the other physical programming units are also grouped into multiple physical programming unit groups by the same method. In other words, in the exemplary embodiment of FIG. 11, the physical erasing unit includes 258 physical programming units in total, and the lower physical programming unit, the center physical programming unit and the upper physical programming unit constituted by multiple memory cells arranged on the same word line can constitute one physical programming unit group. Therefore, the physical erasing unit of FIG. 11 may be divided into 86 physical programming unit groups in total. However, it should be noted that, the invention is not intended to limit the numbers of the physical programming unit or the physical programming unit groups in the physical erasing unit.

Figure 12:
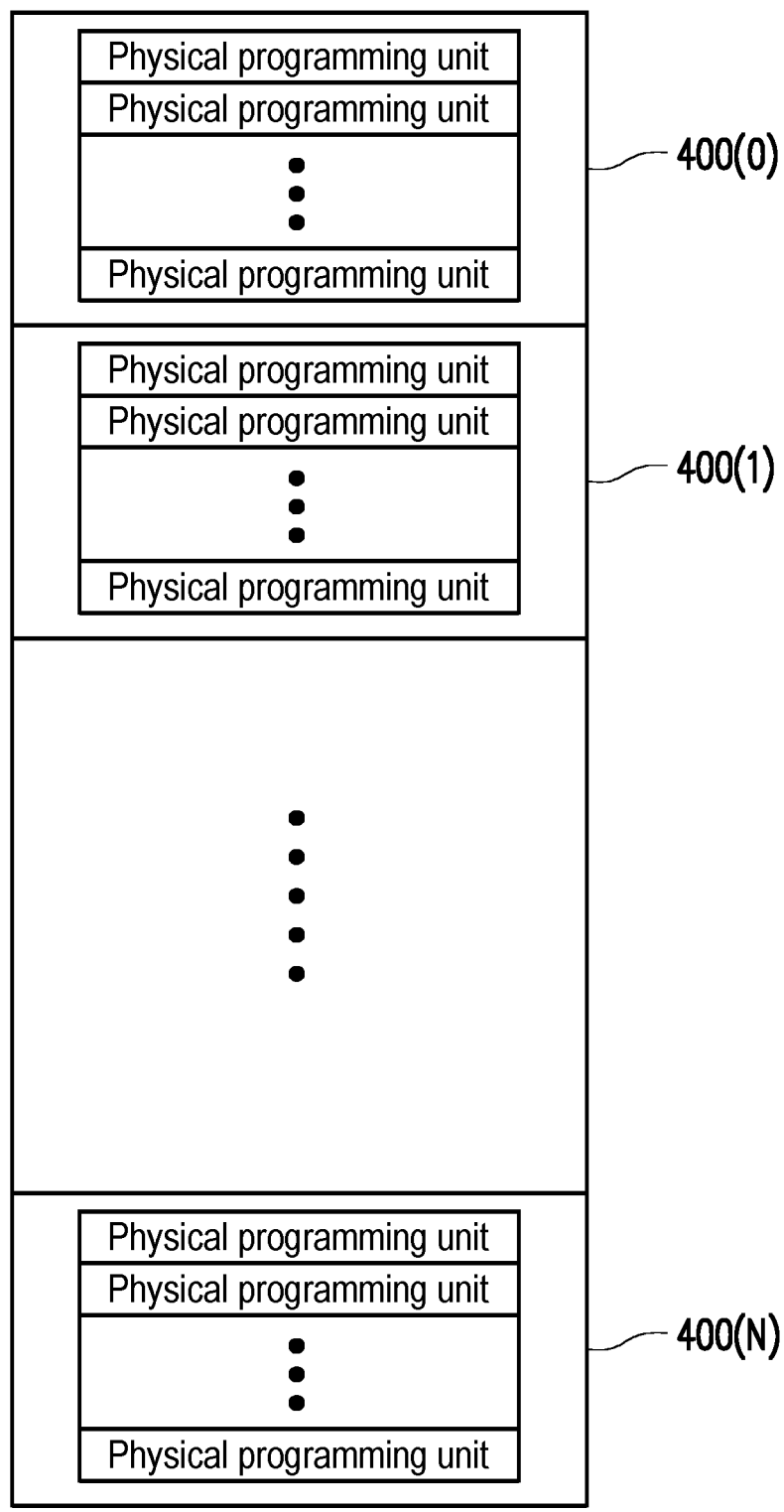
FIG. 12 is a schematic diagram illustrating management of a rewritable non-volatile memory module according to an exemplary embodiment of the invention.

FIG. 12 is a schematic diagram illustrating management of a rewritable non-volatile memory module according to an exemplary embodiment of the invention.

Referring to FIG. 12, the memory cells 502 of the rewritable non-volatile memory module 406 constitute a plurality of physical programming units, and the physical programming units constitute a plurality of physical erasing units 400(0) to 400(N). Specifically, the memory cells on the same word line constitute one or more of the physical programming units. If each of the memory cells can store more than two bits, the physical programming units on the same word line can be classified into a lower physical programming unit and an upper physical programming unit. For instance, the LSB of each memory cell is the lower physical programming unit, and the MSB of each memory cell is the upper physical programming unit. In this exemplary embodiment, the physical programming unit is the minimum unit for programming. That is, the physical programming unit is the minimum unit for writing data. For example, the physical programming unit is a physical page or a physical sector. When the physical programming unit is the physical page, each physical programming unit usually includes a data bit area and a redundancy bit area. The data bit area has multiple physical sectors configured to store user data, and the redundant bit area is configured to store system data (e.g., an error correcting code). In the present exemplary embodiment, each of the data bit areas contains 32 physical sectors, and a size of each physical sector is 512-byte (B). However, in other exemplary embodiments, the data bit area may also include 8, 16, or more or less physical sectors, and the invention is not intended to limit the size and number of the physical sectors. On the other hand, the physical erasing unit is the minimum unit for erasing. Namely, each physical erasing unit contains the least number of memory cells to be erased together. For instance, the physical erasing unit is a physical block.

Figure 13:
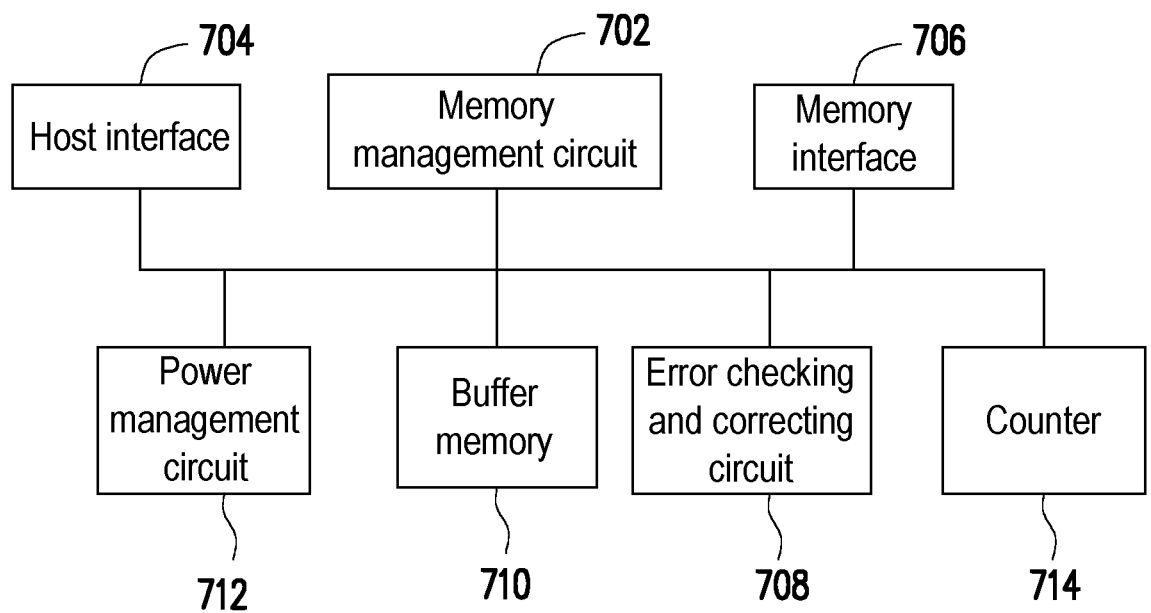
FIG. 13 is a schematic block diagram illustrating a memory controlling circuit unit according to an exemplary embodiment.

FIG. 13 is a schematic block diagram illustrating a memory controlling circuit unit according to an exemplary embodiment. It should be understood that, the structure of the memory controlling circuit unit depicted in FIG. 13 is only an example, and the invention is not limited thereto.

Referring to FIG. 13, the memory controlling circuit unit 404 includes a memory management circuit 702, a host interface 704, a memory interface 706 and an error checking and correcting circuit 708.

The memory management circuit 702 is configured to control overall operations of the memory controlling circuit unit 404. Specifically, the memory management circuit 702 has a plurality of control commands. When the memory storage device 10 operates, the control commands are executed to perform various operations such as data writing, data reading and data erasing. Hereinafter, description regarding operations of the memory management circuit 702 or any circuit element in the memory controlling circuit unit 404 is equivalent to description regarding operations of the memory controlling circuit unit 404.

In this exemplary embodiment, the control commands of the memory management circuit 702 are implemented in form of firmware. For instance, the memory management circuit 702 has a microprocessor unit (not illustrated) and a ROM (not illustrated), and the control commands are burned into the ROM. When the memory storage device 10 operates, the control commands are executed by the microprocessor to execute operations of writing, reading or erasing data.

In another exemplary embodiment, the control commands of the memory management circuit 702 may also be stored as program codes in a specific area (e.g., the system area in a memory exclusively used for storing system data) of the rewritable non-volatile memory module 406. In addition, the memory management circuit 702 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 406 to the RAM of the memory management circuit 702 when the memory controlling circuit unit 404 is enabled. Then, the control commands are executed by the microprocessor unit to execute operations, such as writing, reading or erasing data.

Further, in another exemplary embodiment, the control commands of the memory management circuit 702 may also be implemented in form of hardware. For example, the memory management circuit 702 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to issue a write command sequence for the rewritable non-volatile memory module 406 to write data into the rewritable non-volatile memory module 406. The memory reading circuit is configured to issue a read command sequence for the rewritable non-volatile memory module 406 to read data from the rewritable non-volatile memory module 406. The memory erasing circuit is configured to issue an erase command sequence for the rewritable non-volatile memory module 406 to erase data from the rewritable non-volatile memory module 406. The data processing circuit is configured to process data to be written into the rewritable non-volatile memory module 406 and data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 702 may further give command sequence of other types to the rewritable non-volatile memory module 406 for instructing to perform the corresponding operations.

The host interface 704 is coupled to the memory management circuit 702 and configured to receive and identify commands and data sent from the host system 11. In other words, the commands and data transmitted by the host system 11 are transmitted to the memory management circuit 702 via the host interface 704. In this exemplary embodiment, the host interface 704 is compatible with the SATA standard. Nevertheless, it should be understood that the disclosure is not limited in this regard. The host interface 704 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 706 is coupled to the memory management circuit 702 and configured to access the rewritable non-volatile memory module 406. In other words, data to be written into the rewritable non-volatile memory module 406 is converted into a format acceptable by the rewritable non-volatile memory module 406 via the memory interface 706. Specifically, if the memory management circuit 702 intends to access the rewritable non-volatile memory module 406, the memory interface 706 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection procedure). These command sequences are generated by the memory management circuit 702 and transmitted to the rewritable non-volatile memory module 406 via the memory interface 706, for example. The command sequences may include one or more signals, or data transmitted in the bus. The signals or the data may include command codes and program codes. For example, information such as identification codes and memory addresses are included in the read command sequence;

The error checking and correcting circuit 708 is coupled to the memory management circuit 702 and configured to perform an error checking and correcting operation to ensure integrity of data. Specifically, when the memory management circuit 702 receives the writing command from the host system 11, the error checking and correcting circuit 708 generates an error correcting code (ECC) or an error detecting code (EDC) for data corresponding to the writing command, and the memory management circuit 702 writes data and the ECC or the EDC corresponding to the writing command to the rewritable non-volatile memory module 406. Then, when the memory management circuit 702 reads the data from the rewritable non-volatile memory module 406, the corresponding ECC and/or the EDC are also read, and the error checking and correcting circuit 708 performs the error checking and correcting operation on the read data based on the ECC and/or the EDC.

In an exemplary embodiment of the invention, the memory controlling circuit unit 404 further includes a buffer memory 710 and a power management circuit 712. The buffer memory 710 is coupled to the memory management circuit 702 and configured to temporarily store data and commands from the host system 11 or data from the rewritable non-volatile memory module 406. The power management unit 712 is coupled to the memory management circuit 702 and configured to control a power of the memory storage device 10.

In an exemplary embodiment of the invention, the memory controlling circuit unit 404 further includes a counter 714. The counter 714 is coupled to the memory management circuit 702 and configured to count related information of read data when reading data from the rewritable non-volatile memory module 406.

Figure 14:
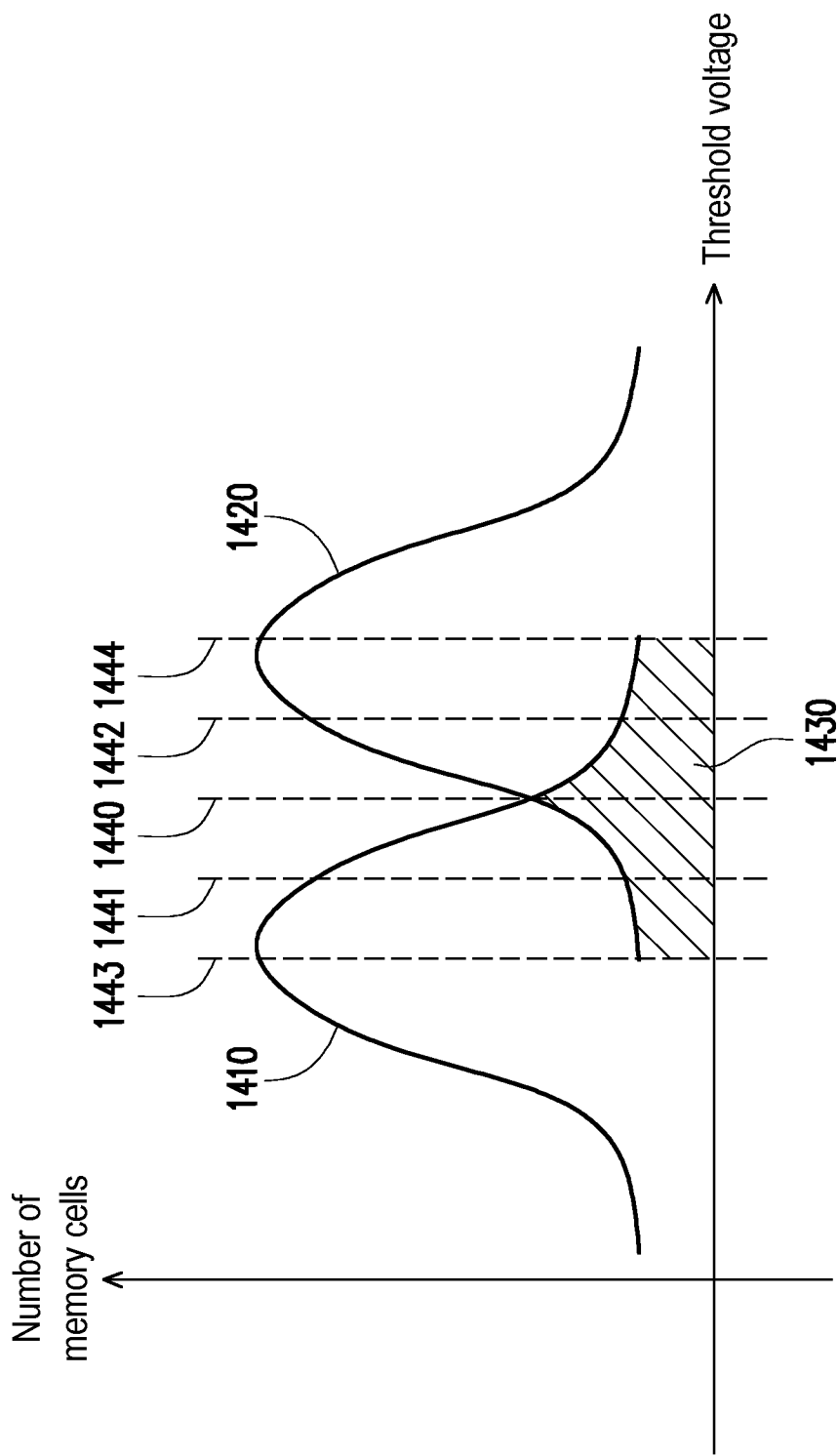
FIG. 14 is a schematic diagram illustrating a hard bit mode decoding according to an exemplary embodiment.

FIG. 14 is a schematic diagram illustrating a hard bit mode decoding according to an exemplary embodiment.

Referring to FIG. 14, with the SLC flash memory taken as an example, a distribution 1410 and a distribution 1420 are used for representing storage states of a plurality of memory cells, and the distribution 1410 and the distribution 1420 respectively represents different storage states. These memory cells may belong to the same physical programming unit or different physical programming units, and the invention is not limited thereto. Here, it is assumed that when one memory cell belongs to the distribution 1410, the bit stored by that memory cell is "1"; and when one memory cell belongs to the distribution 1420, the bit stored by that memory cell is "0". When the memory management circuit 702 uses a read voltage 1440 to read the memory cell, the memory management circuit 702 would obtain a verification bit, which is used to indicate whether that memory cell is turned on. Here, it is assumed that the verification bit is "1" when the memory cell is turned on, otherwise it is "0", but the invention is not limited thereto. If the verification bit is "1", the memory management circuit 702 determines that this memory cell belongs to distribution 1410, and belongs to the distribution 1420 otherwise. The distribution 1410 and the distribution 1420 overlap with each other in a region 1430. Namely, some memory cells belonging to the distribution 1410 are recognized as belonging to the distribution 1420, and some memory cells belonging to the distribution 1420 are recognized as belonging to the distribution 1410.

In this exemplary embodiment, when reading those memory cells, the memory management circuit 702 would select a read voltage (e.g., a read voltage 1441) for reading the memory cells to obtain the verification bits of the memory cells. The error checking and correcting circuit 708 performs a decoding operation containing a probability decoding algorithm according to the verification bits of the memory cells to generate a plurality of decoding bits, and the decoding bits may constitute a codeword.

In this exemplary embodiment, the probability decoding algorithm is to take a possible decoding result of a symbol as a candidate, and information input during the decoding process or values of an intermediate operation process are indicated by probabilities of the candidates or a ratio of probabilities between the candidates, so as to determine the most possible candidate. For example, if one symbol has two candidates (bits 0 and 1), the probability decoding algorithm is to calculate the most possible candidate according to occurrence probabilities of 0 or 1, or calculate the most possible candidate according to a probability ratio between 0 and 1. It is assumed that there are N candidates, for example, possible values are 0 to N−1 (N is a positive integer, and each candidate represents multiple bits) under a finite field, the probability decoding algorithm is to respectively calculate the probabilities of the N candidates to determine the most possible candidate, or take the probability of one of the values as a denominator to calculate a relative probability ratio to determine the most possible candidate. In an exemplary embodiment, the aforementioned probability ratio may be represented in form of logarithm.

In this exemplary embodiment, the probability decoding algorithm may also be a convolutional code, a turbo code, a low-density parity-check code or other algorithms with probability decoding features. For instance, in the convolutional code and the turbo code, a finite state machine may be applied for encoding and decoding, and the most possible states may be calculated according to the verification bits in this exemplary embodiment, so as to generate the decoding bits. The low-density parity-check code is taken as an example for description.

If the low-density parity-check code is used, when the decoding operation is performed according to the verification bits, the memory management circuit 702 further obtains a decoding initial value of each memory cell according to each of the verification bits. For example, if the verification bit is "1", the memory management circuit 702 sets the decoding initial value of the corresponding memory cell to n; and if the verification bit is "0", the decoding initial value is −n. Here, n is a positive integer. However, the value of the positive integer n is not particularly limited by the invention. In an embodiment, n is, for example, 8.

Then, the error checking and correcting circuit 708 performs an iterative decoding of the low-density parity-check algorithm according to the decoding initial values to generate a codeword including a plurality of decoding bits. In the iterative decoding, the decoding initial values are continuously updated to represent a probability, and the probability is also referred to as a reliability or a belief. The updated decoding initial values may be converted into a plurality of decoding bits, and the error checking and correcting circuit 708 may take the decoding bits as a vector, and multiply the vector with a module 2 matrix of a parity-check matrix of the low-density parity-check algorithm, so as to obtain a plurality of syndromes. The syndromes may be used for determining whether the codeword composed of the decoding bits is a valid codeword. If the codeword composed of the decoding bits is the valid codeword, the iterative decoding is stopped, and the error checking and correcting circuit 708 outputs the codeword composed of the decoding bits. If the codeword composed of the decoding bits is an invalid codeword, the decoding initial values are continually updated to generate new decoding bits to perform a next iteration. When the number of iterations reaches a predetermined iteration times, the iterative decoding is stopped. The error checking and correcting circuit 708 determines whether a decoding is successful by using the decoding bits generated by the last iteration. For example, if it is determined that the decoding bits generated by the last iteration constitute the valid codeword according to the syndromes, the decoding is successful; and if the first decoding bits constitute the invalid codeword, it means that the decoding is failed.

In another exemplary embodiment, the probability decoding algorithm included in the decoding operation is the convolutional code and the turbo code, and the decoding operation further includes other error correcting codes. For example, the convolutional code and the turbo code may be used in collaboration with a parity code of any algorithm. In the decoding operation, after execution of the decoding part of the convolutional code or the turbo code is completed, the parity code may be used for determining whether the codeword composed of the generated decoding bits is the valid codeword, so as to determine whether the decoding is successful.

Regardless of the type of the used error correcting code, if the decoding is failed, it means that the memory cells store uncorrectable error bits. If the decoding is failed, the memory management circuit 702 re-obtains another read voltage, and uses the another read voltage (e.g., a read voltage 1442) to read the memory cells, so as to re-obtain the verification bits of the memory cells. The memory management circuit 702 performs the decoding operation according to the re-obtained verification bits to obtain another codeword composed of a plurality of decoding bits. In an exemplary embodiment, the error checking and correcting circuit 708 determines whether the another codeword is a valid codeword according to the syndromes corresponding to the another codeword. If the another codeword is not the valid codeword, the memory management circuit 702 determines that the decoding is failed. If the number of times the read voltage is re-obtained does not exceed a preset number of times, the memory management circuit 702 would re-obtain other read voltages (e.g., a read voltage 1443), and reads the memory cells according to the re-obtained read voltage 1443 to re-obtain the verification bits and perform the decoding operation.

In other words, if there are the uncorrectable error bits, by re-obtaining the read voltage, the verification bits of some memory cells are changed, so as to change some probabilities in the probability decoding algorithm, and it accordingly has a chance to change the decoding result of the decoding operation. Logically, the operation of re-obtaining the read voltage is required to flip some bits in one codeword, and re-decode the new codeword. In certain cases, the codeword that is undecodable before the flip (there are the uncorrectable error bits) may become decodable after the flip. Also, in an exemplary embodiment, the memory management circuit 702 would attempt the decoding several times until the number of attempts exceeds the preset number of times. Nevertheless, the invention is not intended to limit the preset number of times.

It should be noted that, although the SLC flash memory is used as the example in FIG. 14, the steps of re-obtaining the read voltage are also applicable to the MLC or TLC flash memories. As shown by FIG. 9, changing a read voltage VA would require flipping the LSB of one memory cell, and changing read voltage VB or VC would require flipping the MSB of one memory cell. Therefore, changing the read voltage VA, VB or VC can change one codeword to another codeword. The result of changing the codeword is also applicable to the TLC flash memory of FIG. 10. The invention is not limited to the use of SLC, MLC or TLC flash memory.

In the exemplary embodiment of FIG. 14, the decoding initial values of the memory cells are divided into two values (e.g., n and −n) according to one verification bit. The iterative decoding executed according to the two values is also referred to as the iterative decoding in a hard bit mode (a.k.a. a hard bit mode decoding operation). However, the step of changing the read voltage may also be applied to the iterative decoding in a soft bit mode (a.k.a. a soft bit mode decoding operation), where the decoding initial values of each memory cell are determined according to a plurality of verification bits. It should be noted that regardless of the hard bit mode or the soft bit mode, the probabilities of the bits are calculated in the iterative decoding, so that the hard bit mode or the soft bit mode all belong to the probability decoding algorithm.

Figure 15:
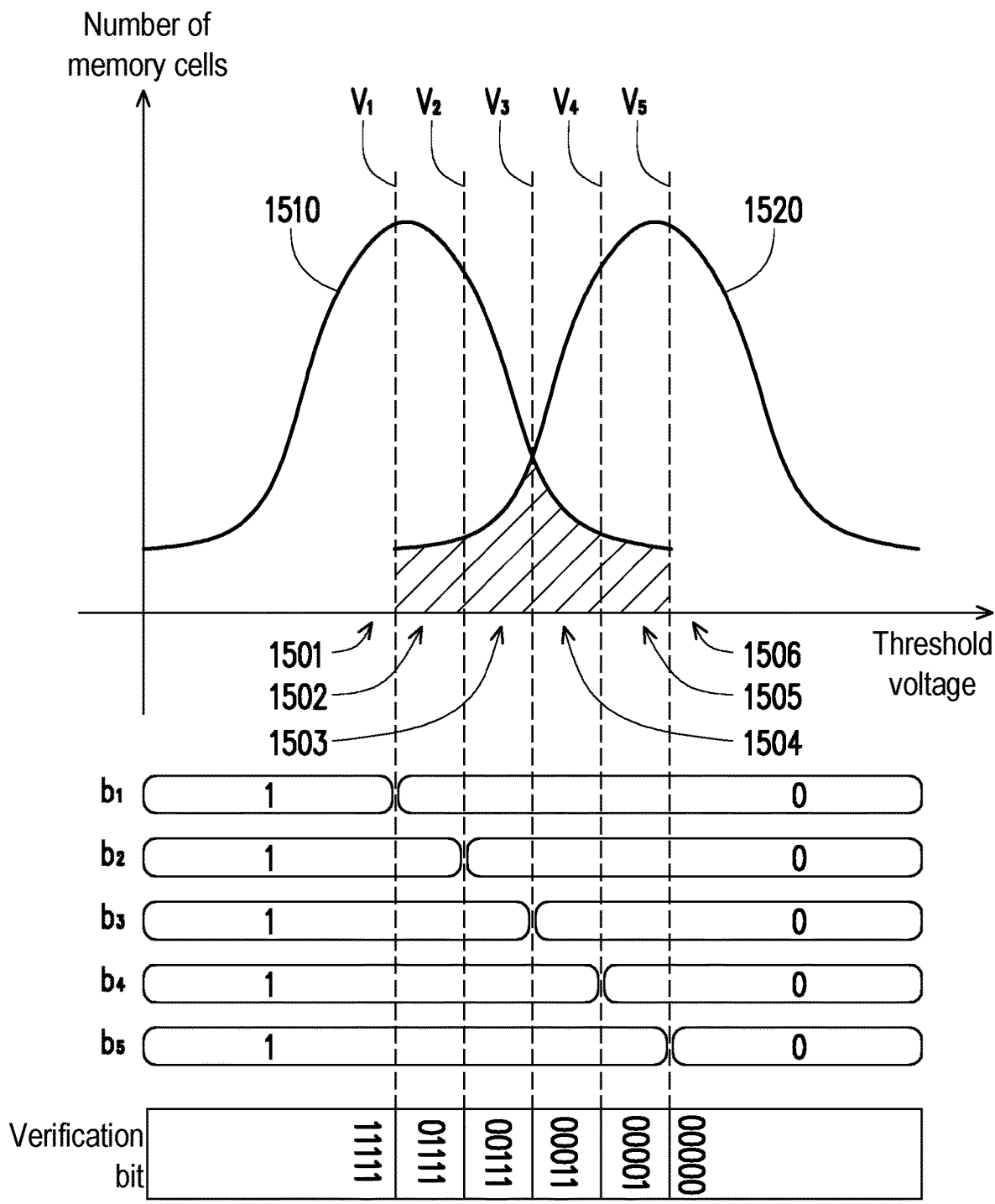
FIG. 15 is a schematic diagram illustrating a soft bit mode decoding according to an exemplary embodiment.

FIG. 15 is a schematic diagram illustrating a soft bit mode decoding according to an exemplary embodiment.

As described above, after a read voltage is applied to the control gate of the memory cell, the verification bit obtained by the memory management circuit 702 may be "0" or "1" depending on whether the memory cell is turned on. Herein, it is assumed that the corresponding verification bit is "0" when the memory cell is not turned on, otherwise, it is "1". In FIG. 15, the memory management circuit 702 applies read voltages $V_1$ to $V_5$ to the memory cells to obtain 5 verification bits. Specifically, the read voltage $V_1$ corresponds to a verification bit $b_1$; the read voltage $V_2$ corresponds to a verification bit $b_2$; the read voltage $V_3$ corresponds to a verification bit $b_3$; the read voltage $V_4$ corresponds to a verification bit $b_4$; the read voltage $V_5$ corresponds to a verification bit $b_5$. If a threshold voltage of one memory cell is within an interval 1501, starting from the verification bit $b_1$ to the verification bit $b_5$, the verification bits obtained by the memory management circuit 702 are "11111"; if the threshold voltage of the memory cell is within an interval 1502, the verification bits are "01111"; if the threshold voltage of the memory cell is within an interval 1503, the verification bits are "00111"; if the threshold voltage of the memory cell is within an interval 1504, the verification bits are "00011"; if the threshold voltage of the memory cell is within an interval 1505, the verification bits are "00001"; if the threshold voltage of the memory cell is within an interval 1506, the verification bits are "00000".

In this exemplary embodiment, one of the read voltages $V_1$ to $V_5$ is set to a sign read voltage. The plus-minus sign read voltage is used to determine a plus-minus sign of a decoding initial value. For example, if the read voltage $V_3$ is the plus-minus sign read voltage, the decoding initial values corresponding to the intervals 1501 to 1503 are smaller than 0, and the decoding initial values corresponding to the intervals 1504 to 1506 are greater than 0. Further, in each of the intervals, a probability of the memory cell belonging to a distribution 1510 and a probability of the memory cell belonging to a distribution 1520 may be calculated in advance. A log likelihood ratio (LLR) may be calculated according to said two probabilities. The log likelihood ratio may be used to decide a size of an absolute value of the decoding initial value. Accordingly, the memory management circuit 702 obtains the decoding initial values of the memory cells in the soft bit mode according to the plus-minus sign read voltage and the verification bits $b_1$ to $b_5$. For instance, the decoding initial values corresponding to the intervals 1501 to 1503 may respectively be −8, −4 and −3 and the decoding initial values corresponding to the intervals 1504 to 1506 may respectively be 3, 4 and 8. In an exemplary embodiment, the decoding initial value corresponding to each of the intervals may be calculated and stored in a lookup table in advance. The memory management circuit 702 may input the verification bits $b_1$ to $b_5$ to the lookup table, so as to obtain the corresponding decoding initial values. In other words, practically, the memory management circuit 702 may also obtain the decoding initial values of the memory cells in the soft bit mode according to the verification bits $b_1$ to $b_5$ without referring to the plus-minus sign read voltage. In addition, if different plus-minus sign voltages are set, the memory management circuit 702 may then use different lookup tables.

After the decoding initial values are obtained by the memory management circuit 702, the error checking and correcting circuit 708 performs the iterative decoding on the decoding initial values to obtain a codeword composed of a plurality of decoded bits, and uses the codeword composed of the decoded bits to determine whether the decoding is successful. If the decoding is failed, the memory management circuit 702 may re-obtain another read voltage.

Because the log likelihood ratio corresponding to each interval changes after said another read voltage is re-obtained, the memory management circuit 702 uses a different lookup list to obtain the decoding initial values. Logically, changing the read voltage is to flip certain bits in one codeword and give different decoding initial values (by changing the value or the plus-minus sign), so that the codeword that is undecodable before changing (with uncorrectable error bit) becomes decodable after changing.

In the exemplary embodiment of FIG. 15, the decoding initial values for the soft bit mode decoding (a.k.a. the soft bit mode decoding operation) are determined according to the 5 verification bits (the read voltages). However, in other exemplary embodiments, the decoding initial values for the soft bit mode decoding may also be determined by more or less verification bits, and the invention is not limited thereto.

In general, during operation of the NAND flash memory, a data randomizer circuit (not illustrated) will convert data to be written into the rewritable non-volatile memory module 406 and restore (or reconvert) data read from the rewritable non-volatile memory module 406 so that a distribution of 0 and 1 is even. Specifically, for making the data programmed into the rewritable non-volatile memory module 406 to present an irregular random state, the data will go through a data randomizing process (e.g., editing, calculating or rearranging) before being written, so that the data practically programmed into the physical programming units is properly disarranged in order to prevent the errors from occurring on the data identification due to factors such as uneven distribution, shifts in read voltage or uneven resistance on bit lines. Herein, although new data underwent the data randomizing process is different from original data, a ratio of "0" and "1" in the new data may be identical to or different from that of the original data. Similarly, because the data practically programmed into the physical programming units is already converted, the data read from the rewritable non-volatile memory module 406 also needs to go through a restoring process of the data randomizer circuit to be restored back to the original data.

In an exemplary embodiment, data to be stored may first go through an encoding process performed by the error checking and correcting circuit 708 to generate encoded data before the data randomization circuit performs a converting process on the encoded data. Nonetheless, in another exemplary embodiment, the data to be stored may first go through the converting process performed by the data randomization circuit to generate converted data before the error checking and correcting circuit 708 performs the encoding process on the converted data. In addition, the data randomization circuit may be implemented independently of the error checking and correcting circuit 708, or may be implemented in the error checking and correcting circuit 708.

However, due to change over time and usage states including program/erase cycles (P/E Cycle), data retention, temperature, read count or read level, the rewritable non-volatile memory module 406 may change a memory state (e.g., changes the original distribution of 0 and 1 form even to uneven). Accordingly, after data is read from the rewritable non-volatile memory module 406, the decoding method proposed by the invention may find a state of the distribution of 0 and 1 in the data, adjust the log likelihood ratio (a.k.a. a decoding parameter) corresponding to the data to a specific value according to the status of the distribution of 0 and 1, and decode the read data according to the decoding initial value corresponding to the adjusted log likelihood ratio. In particular, since the log likelihood ratio corresponding to a current memory state may be obtained by adjusting the log likelihood ratio of the corresponding data to the specific value, a probability of successful decoding may be increased accordingly.

It should be noted that, in the following description, operations of the memory controlling circuit unit 404 are equivalent to operations of the memory management circuit 702.

In this exemplary embodiment, a read command sequence received by the memory controlling circuit unit 404 is for reading bits from memory cells. Specifically, after receiving the read command sequence, the memory controlling circuit unit 404 first reads the bits from the memory cells. The read bit may be indentified as a first value or a second value. Here, the bit is "1" or "0". In the present exemplary embodiment, "1" is referred to as the first value and "0" is referred to as the second value, but the invention is not limited thereto. In another exemplary embodiment, "1" may also be referred to as the second value and "0" may also be referred to as the first value.

Next, the memory controlling circuit unit 404 calculates a first count value of the first value and a second count value of the second value in the read bits. Specifically, the memory controlling circuit unit 404 calculates the number of bits belonging to the first value (i.e., the first count value) and the number of bits belonging to the second value (i.e., the second count value) in the read bits through the counter 714.

Lastly, the memory controlling circuit unit 404 may adjust a decoding parameter corresponding to the bits to a specific decoding parameter according to the first count value and the second count value, and perform a decoding operation according to the specific decoding parameter. Here, the adjusted decoding parameter affects a probability that each of the bits is considered as an error bit in the decoding operation. In general, the more uneven the distribution of 0 and 1 in the data to be decoded is, the less reliable the state of the memory is. Therefore, in this exemplary embodiment, the memory controlling circuit unit 404 may adjust the decoding parameter corresponding to the bits by calculating a difference between the first count value and the second count value.

Specifically, if the difference between the first count value and the second count value is greater than 0, it means that the number of bits belonging to the first value is greater than the number of bits belonging to the second value in the read bits. This situation indicates that the number of 0 mistakenly read as 1 is more than the number of 1 mistakenly read as 0. That is to say, the first count value may contain more error bits and is thus less reliable, whereas the second count value may contain less error bits and is thus more reliable.

Accordingly, the memory controlling circuit unit 404 reduces the decoding parameter corresponding to the first value and/or increases the decoding parameter corresponding to the second value. On the other hand, if the difference between the first count value and the second count value is less than 0, it means that the number of bits belonging to the first value is less than the number of bits belonging to the second value in the read bits. This situation indicates that the number of 1 mistakenly read as 0 is more than the number of 0 mistakenly read as 1. That is to say, the first count value may contain less error bits and is thus more reliable, whereas the second count value may contain more error bits and is thus less reliable. Accordingly, the memory controlling circuit unit 404 increases the decoding parameter corresponding to the first value and/or reduces the decoding parameter corresponding to the second value. Here, the memory controlling circuit unit 404 may adjust only the decoding parameter corresponding to at least one of the first value and the second value, and may adjust both the decoding parameters respectively corresponding to the first value and the second value. However, the invention is not limited in this regard.

In this exemplary embodiment, a preset threshold may also be used to determine a size for adjusting the decoding parameter corresponding to the first value or the second value. In this exemplary embodiment, the memory controlling circuit unit 404 calculates an absolute value of the difference between the first count value and the second count value. If the absolute value of the difference is greater than a first threshold, the memory controlling circuit unit 404 adjusts the decoding parameter corresponding to the bits to the specific decoding parameter according to a first adjustment value. The preset threshold for determining how the log likelihood ratio is adjusted may be one or more. However, the invention is not limited in this regard. In another embodiment, If the absolute value of the difference between the first count value and the second count value is greater than a second threshold, the memory controlling circuit unit 404 adjusts the decoding parameter corresponding to the bits to the specific decoding parameter according to a second adjustment value. In the present exemplary embodiment, the second threshold is greater than the first threshold, and the second adjustment value is greater than the first adjustment value.

In this exemplary embodiment, an adjustment value for adjusting the decoding parameter to the specific decoding parameter is ±1~3. In another exemplary embodiment, the adjustment value for adjusting the decoding parameter to the specific decoding parameter is ±10~20% of the decoding parameter. The adjustment value is not particularly limited in the invention. The decoding parameter, the preset threshold and the adjustment value described above may be obtained through experiments in advance and stored in a specific area of the rewritable non-volatile memory module 406. However, the invention is not limited in this regard.

In this exemplary embodiment, the decoding parameter may include one or more positive decoding parameters and one or more negative decoding parameters, and an adjustment value for adjusting the positive decoding parameters and an adjustment value for adjusting the negative decoding parameters may be identical or different.

In this exemplary embodiment, the decoding operation may be the hard bit decoding operation or the soft bit decoding operation. In the following description, the embodiments of adjusting the log likelihood ratio in the hard bit decoding operation and the soft bit decoding operation are described respectively.

Figure 16:
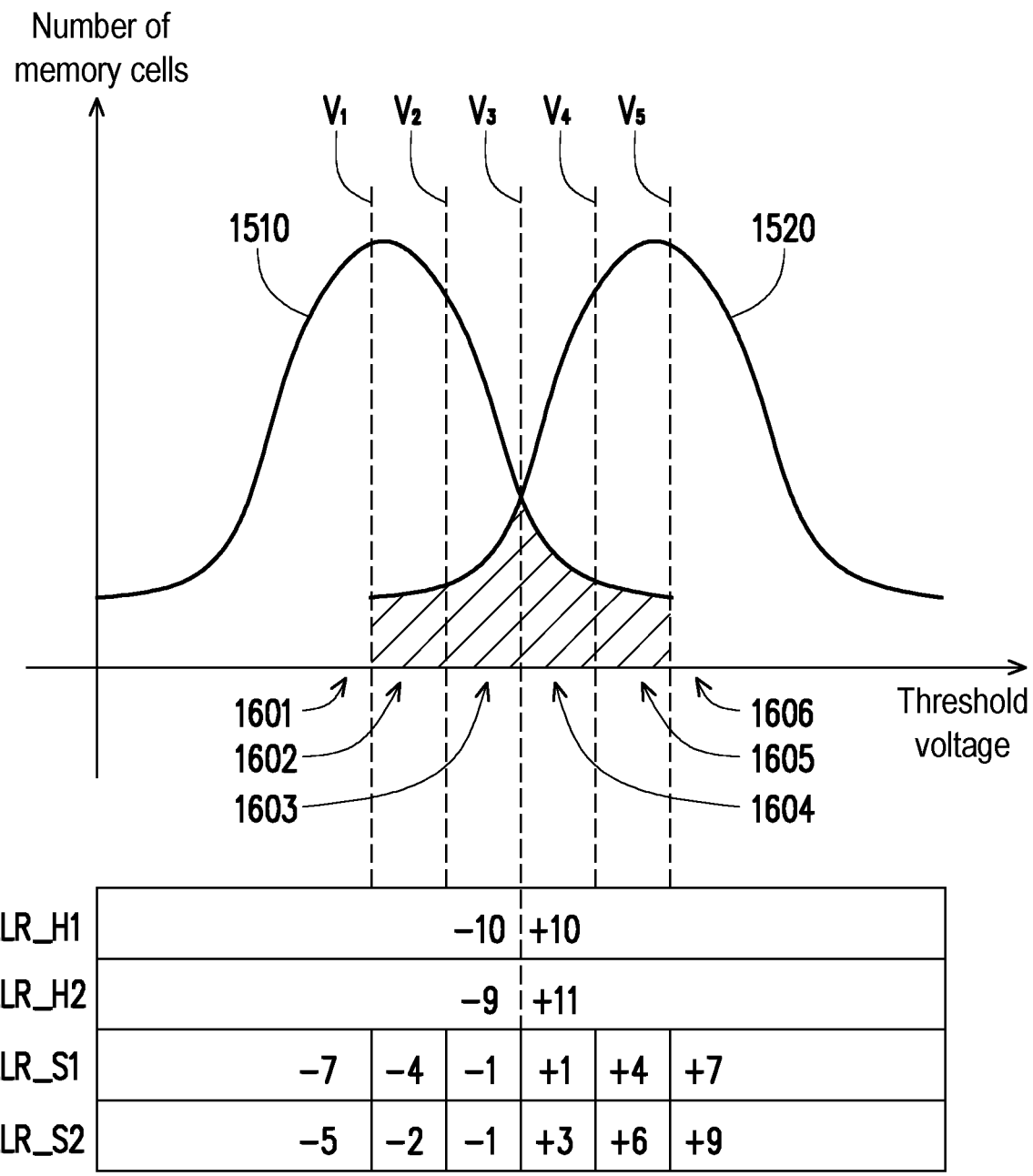
FIG. 16 is an example of a decoding initial value according to an exemplary embodiment.

FIG. 16 is an example of a decoding initial value according to an exemplary embodiment. The log likelihood ratio in the hard bit decoding operation may be used to determine a size of an absolute value of the decoding initial value, and the decoding initial value corresponding to the memory cell is divided into two values (e.g., n and −n) according to one verification bit (e.g., "1" or "0"). The decoding initial value is calculated in advance and stored in one lookup table. Referring to FIG. 16, if the log likelihood ratio is 10, for a decoding initial value LLR_H1, a decoding initial value corresponding to the verification bit "1" is −10, and a decoding initial value corresponding to the verification bit "0" is +10.

Specifically, after receiving the read command sequence, the memory controlling circuit unit 404 first reads the bits from the memory cells, where the read bits may be identified as 0 or 1. Next, the memory controlling circuit unit 404 calculates the number of bits belonging to 0 (i.e., the first count value) and the number of bits belonging to 1 (i.e., the second count value) in the read bits through the counter 714, and determines whether the absolute value of the difference between the first count value and the second count value is greater than the first threshold. In this exemplary embodiment, the absolute value of the difference between the first count value and the second count value is greater than the first threshold (e.g., 100), and thus the memory controlling circuit unit 404 adjusts the log likelihood ratio according to the first adjustment value (e.g., ±1).

Referring to FIG. 16, the memory controlling circuit unit 404 adjusts the decoding initial value LLR_H1 corresponding to the bits to a decoding initial value LLR_H2. In this embodiment, because the difference between the first count value and the second count value is greater than 0, the first count value may contain more error bits and is thus less reliable, whereas the second count value may contain less error bits and is thus more reliable. Accordingly, the memory controlling circuit unit 404 reduces the log likelihood ratio "10" corresponding to the verification bit "1" by 1 such that the decoding initial value is adjusted to be −9, and increase the log likelihood ratio "10" corresponding to the verification bit "0" by 1 such that the decoding initial value is adjusted to be +11, as shown by FIG. 16. After the memory controlling circuit unit 404 obtains the adjusted log likelihood ratio and accordingly obtains the corresponding decoding initial value, the error checking and correcting circuit 708 performs the iterative decoding according to the decoding initial values to obtain a codeword composed of a plurality of decoded bits, and uses the codeword composed of the decoded bits to determine whether the decoding is successful. It should be noted that a person of ordinary skill in the art should know how to perform the iterative decoding based on the log likelihood ratio, and thus details regarding the same are not repeated hereinafter.

In the soft bit decoding operation, it is assumed that, as calculated in advance, the log likelihood ratios corresponding to intervals 1601 and 1606 are "7"; the log likelihood ratios corresponding to intervals 1602 and 1605 are "4"; the log likelihood ratios corresponding to intervals 1603 and 1604 are "1". Among decoding initial values of a decoding initial value LLR_S1 of the memory cells in the soft bit decoding operation obtained by the memory controlling circuit unit 404 according to the plus-minus sign read voltage $V_3$ and the verification bits, the decoding initial values corresponding to the intervals 1601 to 1603 are respectively −7, −4 and −1, and the decoding initial values corresponding to the intervals 1604 to 1606 are respectively +1, +4 and +7.

Specifically, after receiving the read command sequence, the memory controlling circuit unit 404 first reads the bits from the memory cells, where the read bits may be identified as 0 or 1. Next, the memory controlling circuit unit 404 calculates the number of bits belonging to 0 (i.e., the first count value) and the number of bits belonging to 1 (i.e., the second count value) in the read bits through the counter 714, and determines whether the absolute value of the difference between the first count value and the second count value is greater than the first threshold or the second threshold. If the absolute value of the difference is greater than the first threshold but less than the second threshold, the memory controlling circuit unit 404 adjusts the log likelihood ratio according to the first adjustment value. If the absolute value of the difference is greater than the second threshold, the memory controlling circuit unit 404 adjusts the log likelihood ratio according to the second adjustment value.

In this exemplary embodiment, the difference between the first count value and the second count value is greater than the second threshold (e.g., 300), and thus the memory controlling circuit unit 404 adjusts the log likelihood ratio according to the second adjustment value (e.g., ±2). Referring to FIG. 16, the memory controlling circuit unit 404 adjusts the decoding initial value LLR_S1 corresponding to the bits to a decoding initial value LLR_S2. In this embodiment, because the difference between the first count value and the second count value is greater than 0, the first count value may contain more error bits and is thus less reliable, whereas the second count value may contain less error bits and is thus more reliable. Accordingly, the memory controlling circuit unit 404 reduces the log likelihood ratio "7" corresponding to the interval 1601 by 2 such that the decoding initial value is adjusted to be −5; reduces the log likelihood ratio "4" corresponding to the interval 1602 by 2 such that the decoding initial value is adjusted to be −6; reduces the log likelihood ratio "1" corresponding to the interval 1603 by 2 such that the decoding initial value is maintained at −1 at −1 or adjusted to be +1; increases the log likelihood ratio "1" corresponding to the interval 1604 by 2 such that the decoding initial value is adjusted to be +3; increases the log likelihood ratio "4" corresponding to the interval 1605 by 2 such that the decoding initial value is adjusted to be +6; increases the log likelihood ratio "7" corresponding to the interval 1606 by 2 such that the decoding initial value is adjusted to be +9. In this embodiment, when the initial decoding values of the interval 1601 to 1603 are adjusted to be positive values, the highest adjustment is to +1; and when the initial decoding values of the interval 1604 to 1606 are adjusted to negative values, the lowest adjustment is −1. However, the invention is not limited in this regard. After the memory controlling circuit unit 404 obtains the adjusted log likelihood ratio and accordingly obtains the corresponding decoding initial value, the error checking and correcting circuit 708 performs the iterative decoding according to the decoding initial values to obtain a codeword composed of a plurality of decoded bits, and uses the codeword composed of the decoded bits to determine whether the decoding is successful. It should be noted that a person of ordinary skill in the art should know how to perform the iterative decoding based on the log likelihood ratio, and thus details regarding the same are not repeated hereinafter.

Based on the above, each time after reading data according to the read command sequence (e.g., receiving the new read command sequence, re-obtaining another read voltage), the memory controlling circuit unit 404 may adjust the log likelihood ratio used by the decoding at that time according to the read bits to obtain the corresponding decoding initial value so as to increase the probability of successful decoding.

In another exemplary embodiment, the memory controlling circuit unit 404 may further adjust a voltage level for reading the bits from the memory cells to a second voltage level according to the first count value and the second count value, and execute the decoding operation provided by the invention after the voltage level is adjusted to the second voltage level. Specifically, after receiving the read command sequence, the memory controlling circuit unit 404 first reads the bits from the memory cells. The read bit may be indentified as a first value or a second value. Next, the memory controlling circuit unit 404 calculates a first count value of the first value and a second count value of the second value in the read bits, and adjusts a voltage level of for reading the bits from the memory cells to a second voltage level by calculating a difference between the first count value and the second count value.

For instance, after applying the read voltage $V_3$ on the control gates of the memory cells, if a difference between the first count value and the second count value in the read bits is greater than 0, it means that the number of bits belonging to the first value is greater than the number of bits belonging to the second value in the read bits. This situation indicates that the number of 0 mistakenly read as 1 is more than the number of 1 mistakenly read as 0. That is to say, the first count value may contain more error bits and is thus less reliable, whereas the second count value may contain less error bits and is thus more reliable. Accordingly, the memory controlling circuit unit 404 lowers the read voltage. On the other hand, if the difference between the first count value and the second count value is less than 0, it means that the number of bits belonging to the first value is less than the number of bits belonging to the second value in the read bits. This situation indicates that the number of 1 mistakenly read as 0 is more than the number of 0 mistakenly read as 1. That is to say, the first count value may contain less error bits and is thus more reliable, whereas the second count value may contain more error bits and is thus less reliable. Accordingly, the memory controlling circuit unit 404 increases the read voltage. The adjustment value for adjusting the read voltage may be obtained through experiments in advance and stored in a specific area of the rewritable non-volatile memory module 406. However, the invention is not limited in this regard.

Figure 17:
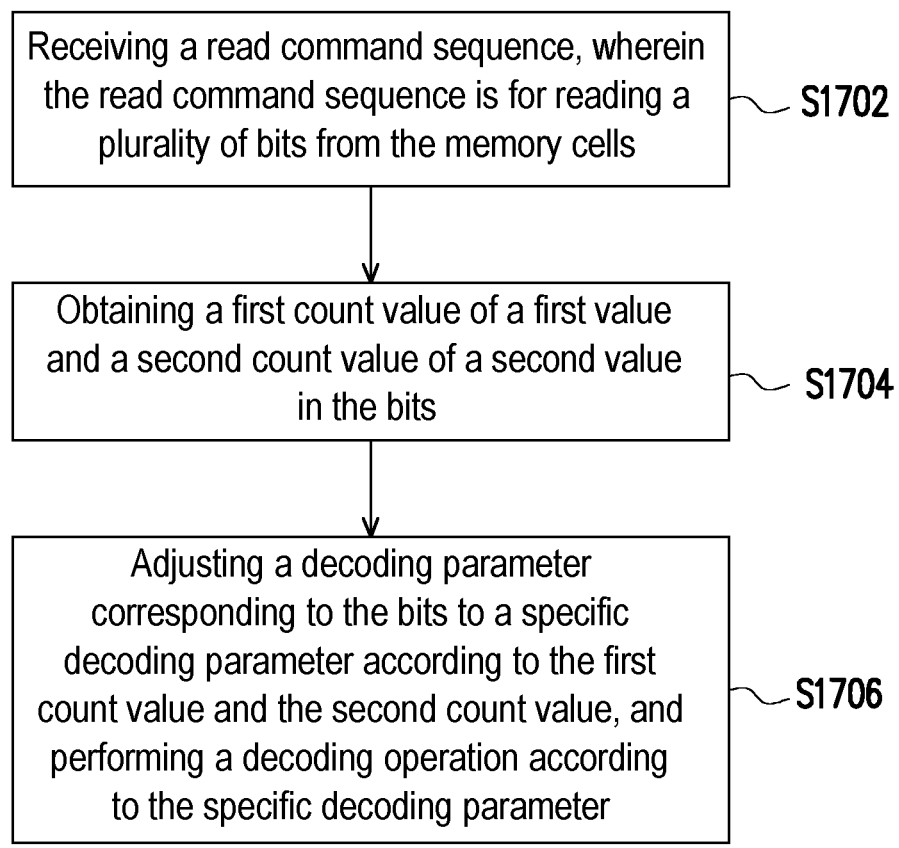
FIG. 17 is a flowchart illustrating a decoding method according to an exemplary embodiment.

FIG. 17 is a flowchart illustrating a decoding method according to an exemplary embodiment. In step S1702, a read command sequence is received, wherein the read command sequence is for reading a plurality of bits from the memory cells. In step S1704, a first count value of a first value and a second count value of a second value in the bits are obtained. In step S1706, a decoding parameter corresponding to the bits is adjusted to a specific decoding parameter according to the first count value and the second count value, and a decoding operation is performed according to the specific decoding parameter.

It should be noted that, the steps depicted in FIG. 17 may be implemented as a plurality of program codes or circuits, which are not particularly limited in the invention. Moreover, the method disclosed in FIG. 17 may be implemented by reference with above exemplary embodiments, or may be implemented separately, which are not particularly limited in the invention.

In summary, the decoding method, the memory storage device and the memory controlling circuit unit provided by the invention can calculate the distribution of the first value and the second value and determine whether the distribution is even. According to the evenness of the distribution, the memory controlling circuit unit can adjust the decoding parameter corresponding to the bits to the specific decoding parameter, and perform the decoding operation again according to the values of the bits and the specific decoding parameter to try and obtain a successfully decoded codeword. With the above method, the decoding correction capability and the probability of successful decoding can be improved to reduce decoding delay.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

The previously described exemplary embodiments of the present invention have the advantages aforementioned, wherein the advantages aforementioned not required in all versions of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoding method for a rewritable non-volatile memory module, wherein the rewritable non-volatile memory module comprises a plurality of memory cells, and the decoding method comprises:
   receiving a read command sequence, wherein the read command sequence is for reading a plurality of bits from the memory cells;
   obtaining a first count value of a first value and a second count value of a second value in the bits;
   adjusting a decoding parameter corresponding to the bits to a specific decoding parameter according to the first count value and the second count value, comprising:
      reducing the decoding parameter corresponding to the first value or increasing the decoding parameter corresponding to the second value in response to a difference between the first count value and the second count value being greater than 0, and
      increasing the decoding parameter corresponding to the first value or reducing the decoding parameter corresponding to the second value in response to the difference between the first count value and the second count value being less than 0; and
   performing a decoding operation according to the specific decoding parameter, wherein the adjusted decoding parameter affects a probability that the bits are considered as an error bit in the decoding operation.

2. The decoding method according to claim 1, wherein the decoding parameter and the specific decoding parameter are a log likelihood ratio (LLR).

3. The decoding method according to claim 1, wherein an adjustment value for adjusting the decoding parameter to the specific decoding parameter is ±1~3.

4. The decoding method according to claim 1, wherein an adjustment value for adjusting the decoding parameter to the specific decoding parameter is ±10~20% of the decoding parameter.

5. The decoding method according to claim 1, wherein the decoding parameter comprises one or more positive decoding parameters and one or more negative decoding parameters, and in the step of adjusting the decoding parameter corresponding to the bits to the specific decoding parameter according to the first count value and the second count value, an adjustment value for the one or more positive decoding parameters is different from an adjustment value for the one or more negative decoding parameters.

6. The decoding method according to claim 1, wherein the decoding parameter comprises one or more positive decoding parameters and one or more negative decoding parameters, and in the step of adjusting the decoding parameter corresponding to the bits to the specific decoding parameter according to the first count value and the second count value, an adjustment value for the one or more positive decoding parameters is identical to an adjustment value of the one for more negative decoding parameters.

7. The decoding method according to claim 1, wherein before the step of adjusting the decoding parameter corresponding to the bits to the specific decoding parameter according to the first count value and the second count value, the decoding method further comprises:
   adjusting a voltage level for reading the bits from the memory cells to a second voltage level according to the first count value and the second count value.

8. The decoding method according to claim 1, wherein the decoding operation is at least one of a hard bit decoding operation and a soft bit decoding operation.

9. A memory storage device, comprising:
   a connection interface unit configured to couple to a host system;
   a rewritable non-volatile memory module, wherein the rewritable non-volatile memory module comprises a plurality of memory cells; and
   a memory controlling circuit unit, coupled to the connection interface unit and the rewritable non-volatile memory module,
   wherein the memory controlling circuit unit is configured to receive a read command sequence, wherein the read command sequence is for reading a plurality of bits from the memory cells,
   the memory controlling circuit unit is further configured to obtain a first count value of a first value and a second count value of a second value in the bits through a counter,
   the memory controlling circuit unit is further configured to adjust a decoding parameter corresponding to the bits to a specific decoding parameter according to the first count value and the second count value, comprising:
      reducing the decoding parameter corresponding to the first value or increasing the decoding parameter corresponding to the second value in response to a difference between the first count value and the second count value being greater than 0, and
      increasing the decoding parameter corresponding to the first value or reducing the decoding parameter corresponding to the second value in response to the difference between the first count value and the second count value being less than 0, and
   the memory controlling circuit unit is further configured to perform a decoding operation according to the specific decoding parameter, wherein the adjusted decoding parameter affects a probability that the bits are considered as an error bit in the decoding operation.

10. The memory storage device according to claim 9, wherein the decoding parameter and the specific decoding parameter are a log likelihood ratio.

11. The memory storage device according to claim 9, wherein an adjustment value for adjusting the decoding parameter to the specific decoding parameter is ±1~3.

12. The memory storage device according to claim 9, wherein an adjustment value for adjusting the decoding parameter to the specific decoding parameter is ±10~20% of the decoding parameter.

13. The memory storage device according to claim 9, wherein the decoding parameter comprises one or more positive decoding parameters and one or more negative decoding parameters, and
in the operation that the memory controlling circuit unit adjusts the decoding parameter corresponding to the bits to the specific decoding parameter according to the first count value and the second count value, an adjustment value for the one or more positive decoding parameters is different from an adjustment value for the one or more negative decoding parameters.

14. The memory storage device according to claim 9, wherein the decoding parameter comprises one or more positive decoding parameters and one or more negative decoding parameters, and
in the operation that the memory controlling circuit unit adjusts the decoding parameter corresponding to the bits to the specific decoding parameter according to the first count value and the second count value, an adjustment value for the one or more positive decoding parameters is identical to an adjustment value of the one for more negative decoding parameters.

15. The memory storage device according to claim 9, wherein before the operation of adjusting the decoding parameter corresponding to the bits to the specific decoding parameter according to the first count value and the second count value, the memory controlling circuit unit is further configured to adjust a voltage level for reading the bits from the memory cells to a second voltage level according to the first count value and the second count value.

16. The memory storage device according to claim 9, wherein the decoding operation is at least one of a hard bit decoding operation and a soft bit decoding operation.

17. A memory controlling circuit unit for controlling a memory storage device comprising a rewritable non-volatile memory module, the memory controlling circuit unit comprising:
a host interface, configured to couple to a host system,
a memory interface, configured to couple to the rewritable non-volatile memory module, wherein the rewritable non-volatile memory module comprises a plurality of memory cells; and
a memory management circuit, coupled to the host interface and the memory interface;
wherein the memory controlling circuit unit is configured to receive a read command sequence, wherein the read command sequence is for reading a plurality of bits from the memory cells,
the memory controlling circuit unit is further configured to obtain a first count value of a first value and a second count value of a second value in the bits through a counter,
the memory controlling circuit unit is further configured to adjust a decoding parameter corresponding to the bits to a specific decoding parameter according to the first count value and the second count value, comprising:
reducing the decoding parameter corresponding to the first value or increasing the decoding parameter corresponding to the second value in response to a difference between the first count value and the second count value being greater than 0, and
increasing the decoding parameter corresponding to the first value or reducing the decoding parameter corresponding to the second value in response to the difference between the first count value and the second count value being less than 0, and
the memory controlling circuit unit is further configured to perform a decoding operation according to the specific decoding parameter, wherein the adjusted decoding parameter affects a probability that the bits are considered as an error bit in the decoding operation.

18. The memory controlling circuit unit according to claim 17, wherein the decoding parameter and the specific decoding parameter are a log likelihood ratio.

19. The memory controlling circuit unit according to claim 17, wherein an adjustment value for adjusting the decoding parameter to the specific decoding parameter is ±1~3.

20. The memory controlling circuit unit according to claim 17, wherein an adjustment value for adjusting the decoding parameter to the specific decoding parameter is ±10~20% of the decoding parameter.

21. The memory controlling circuit unit according to claim 17, wherein the decoding parameter comprises one or more positive decoding parameters and one or more negative decoding parameters, and
in the operation that the memory controlling circuit unit adjusts the decoding parameter corresponding to the bits to the specific decoding parameter according to the first count value and the second count value, an adjustment value for the one or more positive decoding parameters is different from an adjustment value for the one or more negative decoding parameters.

22. The memory controlling circuit unit according to claim 17, wherein the decoding parameter comprises one or more positive decoding parameters and one or more negative decoding parameters, and
in the operation that the memory controlling circuit unit adjusts the decoding parameter corresponding to the bits to the specific decoding parameter according to the first count value and the second count value, an adjustment value for the one or more positive decoding parameters is identical to an adjustment value of the one for more negative decoding parameters.

23. The memory controlling circuit unit according to claim 17, wherein before the operation of adjusting the decoding parameter corresponding to the bits to the specific decoding parameter according to the first count value and the second count value, the memory controlling circuit unit is further configured to adjust a voltage level for reading the bits from the memory cells to a second voltage level according to the first count value and the second count value.

24. The memory controlling circuit unit according to claim 17, wherein the decoding operation is at least one of a hard bit decoding operation and a soft bit decoding operation.

* * * * *